US010770969B2

(12) United States Patent
Peretz

(10) Patent No.: US 10,770,969 B2
(45) Date of Patent: Sep. 8, 2020

(54) DIGITAL AVERAGE CURRENT-MODE CONTROL VOLTAGE REGULATOR AND A METHOD FOR TUNING COMPENSATION COEFFICIENTS THEREOF

(71) Applicant: B. G. NEGEV TECHNOLOGIES AND APPLICATIONS LTD., AT BEN-GURION UNIVERSITY, Beer Sheva (IL)

(72) Inventor: Mor Mordechai Peretz, Lehavim (IL)

(73) Assignee: B. G. Negev Technologies and Applications Ltd., at Ben-Gurion University, Beer Sheva (IL)

(*) Notice: Subject to any disclaimer, the term of this patent is extended or adjusted under 35 U.S.C. 154(b) by 0 days.

(21) Appl. No.: 16/337,283

(22) PCT Filed: Sep. 25, 2017

(86) PCT No.: PCT/IL2017/051069
§ 371 (c)(1),
(2) Date: Mar. 27, 2019

(87) PCT Pub. No.: WO2018/060990
PCT Pub. Date: Apr. 5, 2018

(65) Prior Publication Data
US 2020/0036287 A1   Jan. 30, 2020

Related U.S. Application Data

(60) Provisional application No. 62/400,644, filed on Sep. 28, 2016.

(51) Int. Cl.
*H02M 3/157* (2006.01)
*G05F 1/575* (2006.01)
*H02M 1/00* (2006.01)

(52) U.S. Cl.
CPC .......... *H02M 3/157* (2013.01); *G05F 1/575* (2013.01); *H02M 2001/0009* (2013.01)

(58) Field of Classification Search
CPC ......... H02M 3/157; H02M 2001/0009; H02M 2001/0012
See application file for complete search history.

(56) References Cited

U.S. PATENT DOCUMENTS 8,164,318 B2 * 4/2012 Sasaki ................... H02M 3/157
323/222
9,306,593 B2 * 4/2016 Kawano ................. H03M 1/502
(Continued)

FOREIGN PATENT DOCUMENTS

CN     103051186 A     4/2013
CN     104362851 B     4/2017
(Continued)

OTHER PUBLICATIONS

Written Opinion of the International Searching Authority for PCT/IL2017/051069, dated Dec. 5, 2017 (5 page).
(Continued)

*Primary Examiner* — Harry R Behm
(74) *Attorney, Agent, or Firm* — Roach Brown McCarthy & Gruber, P.C.; Kevin D. McCarthy

(57) ABSTRACT

A digital controller for controlling an average-current-mode voltage regulator with an output connected to a load. The controller comprises a digital voltage-sampling window Analog-to-Digital Converter (ADC), based on Delay-Lines (DLs) and configured to obtain a sample of a voltage error signal being the difference between the reference voltage and the output voltage, and to convert the voltage error signal from analog to digital representation; a digital current-sampling window ADC, based on DLs and configured to obtain a sample of the output current and to convert the current output from analog to digital representation; a digital (Continued)

compensator for voltage regulation, receiving as input the digital voltage error signal, configured to generate a current reference signal based thereupon; a digital compensator for current regulation, receiving as input the current error signal and the current reference signal, configured to generate a duty-ratio command signal based thereupon; and a digital hybrid High Resolution (HR) Digital Pulse Width Modulator (HR-DPWM) receiving as input the duty-ratio command signal and generating a pulse-width-modulated signal that is fed to the gates of the converter's transistors, to thereby control the current and voltage supplied to the load.

12 Claims, 24 Drawing Sheets

(56) References Cited

U.S. PATENT DOCUMENTS

| | | | |
|---|---|---|---|
| 9,379,621 B1 | 6/2016 | Kalyanaranman et al. | |
| 2006/0055574 A1* | 3/2006 | Maksimovic | G04F 10/005 341/155 |
| 2006/0273831 A1* | 12/2006 | Maksimovic | H03M 1/1042 327/103 |
| 2008/0042632 A1 | 2/2008 | Chapuis et al. | |
| 2008/0116871 A1 | 5/2008 | Li et al. | |
| 2008/0164859 A1 | 7/2008 | Peng et al. | |
| 2008/0310201 A1 | 12/2008 | Maksimovic | |
| 2009/0066382 A1 | 3/2009 | Yousefzadeh et al. | |
| 2012/0326685 A1 | 12/2012 | Takahashi | |
| 2016/0261186 A1 | 9/2016 | Jiang et al. | |

FOREIGN PATENT DOCUMENTS

| | | |
|---|---|---|
| EP | 1703624 A2 | 9/2006 |
| WO | 03/050637 A2 | 6/2003 |
| WO | 2015/177786 A1 | 11/2015 |

OTHER PUBLICATIONS

International Search Report for PCT/IL2017/051069, dated Dec. 5, 2017 (5 page).

PCT document entitled "Communication in cases for which no other form is applicable" for PCT/IL2017/051069, mailed Dec. 5, 2017 (1 page).

Communication and Supplementary Partial European Search Report for European application No. EP 17 85 5156, dated May 19, 2020 (18 pages).

Yan-Fei Liu et al., Recent Developments in Digital Control Strategies for DC.DC Switching Power Converters, IEEE Tranactions on Power Electronics, vol. 24, No. 11, Nov. 2009 (11 pages).

Yang Zhang et al., Current Sharing in Digitally Controlled Masterless Multi-Phase DC-DC Converters, IEEE 36TH Conference on Power Electronics Specialist, 2005 (7 pages).

Yung-Chien Chang et al., Predictive Digital Current Mode Controlled DC-DC Converter with Duty Calibration Technique, 2013 1st International Future Energy Electronics Conference (IFEEC), IEEE, 2013 (4 pages).

\* cited by examiner

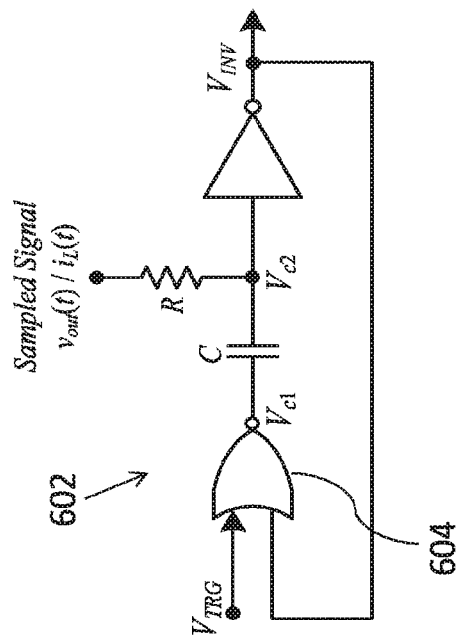
FIG. 6B
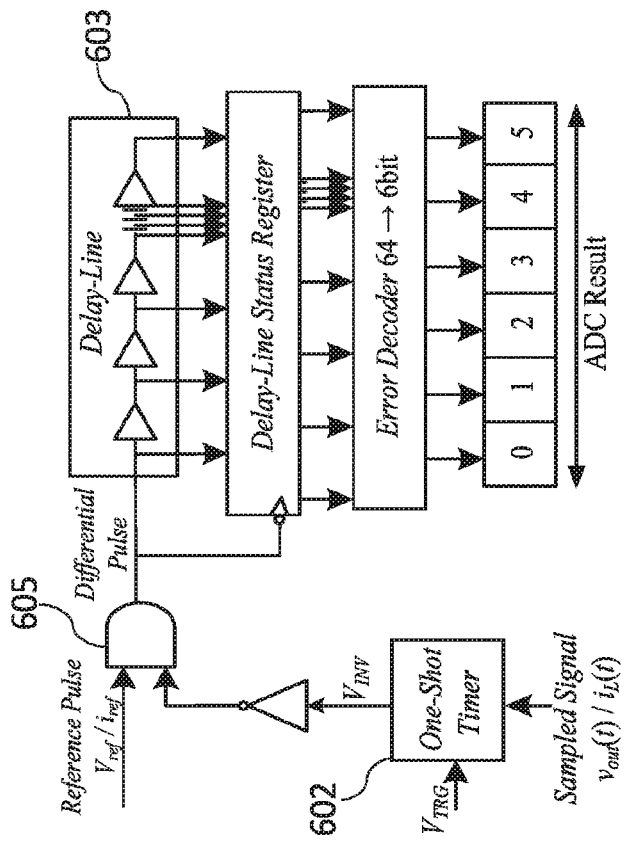
FIG. 6A
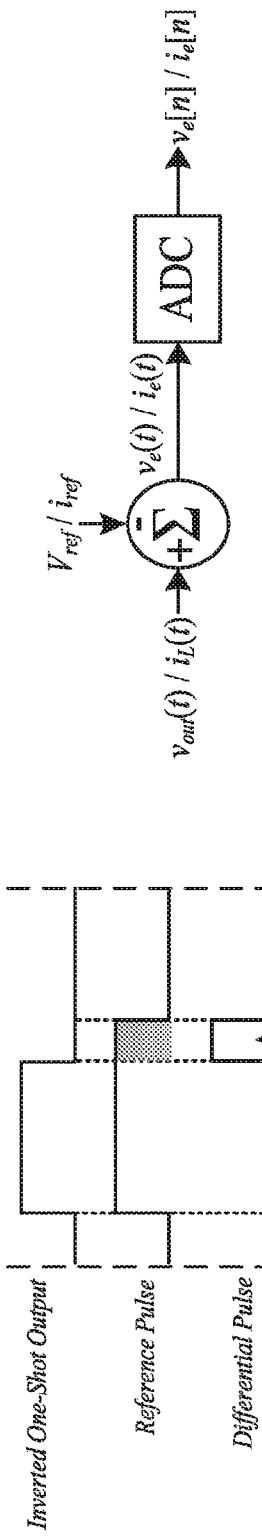
FIG. 6D
FIG. 6C

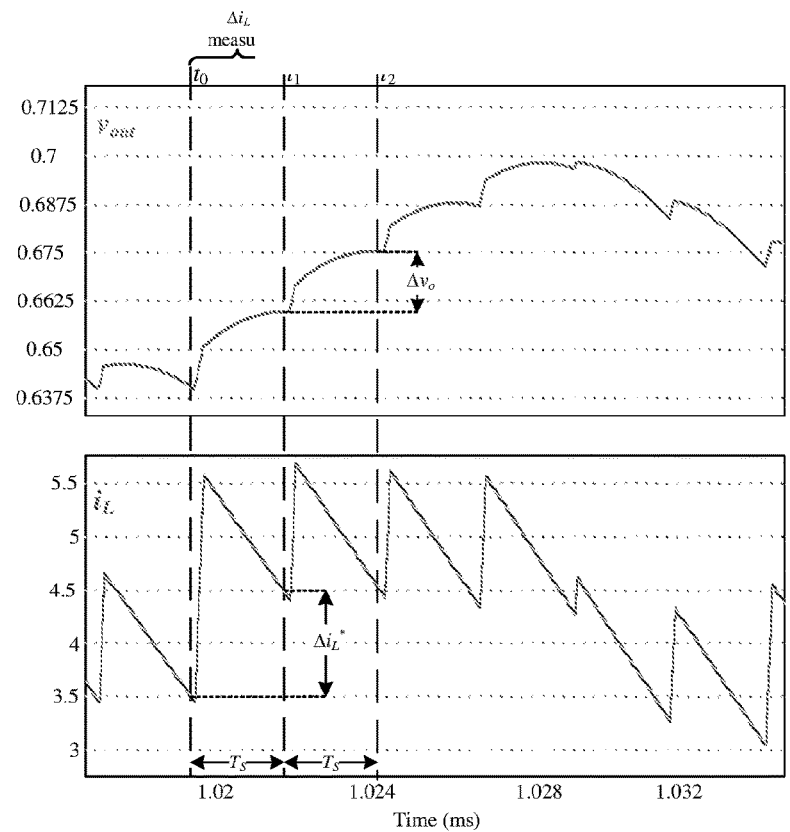
FIG. 26
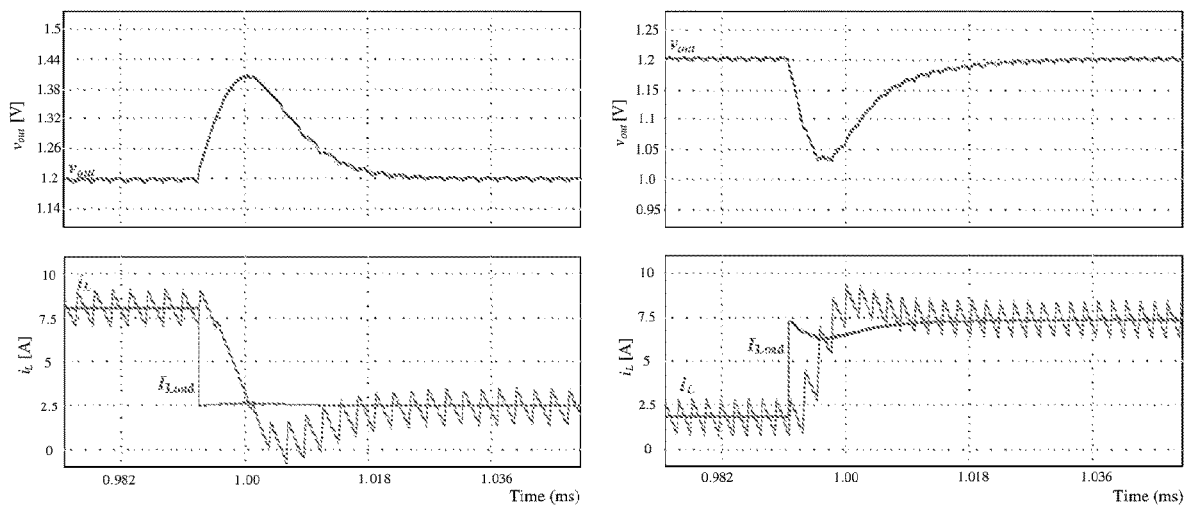
FIG. 27a  FIG. 27b

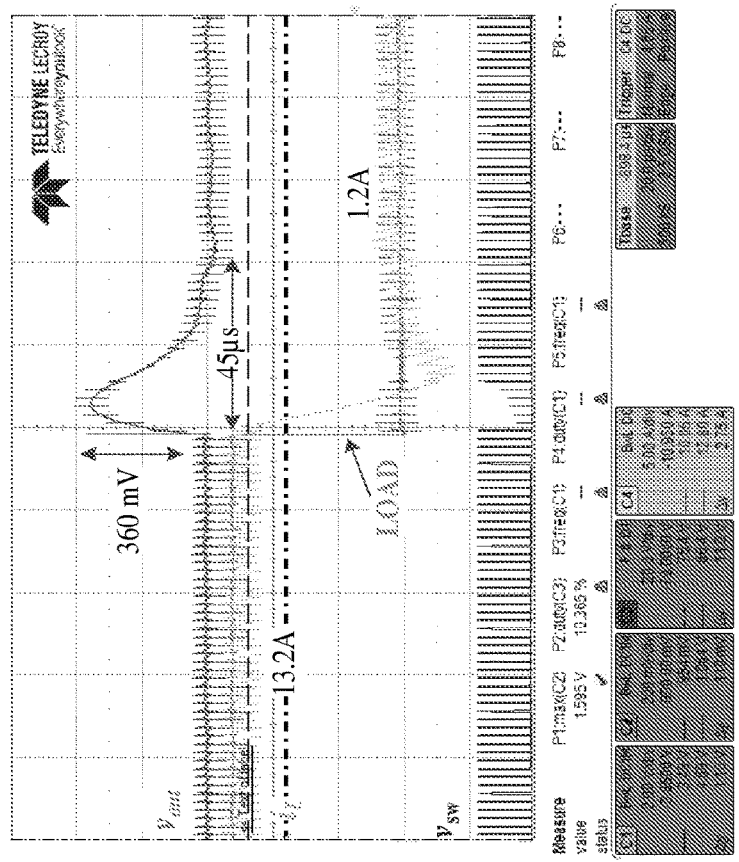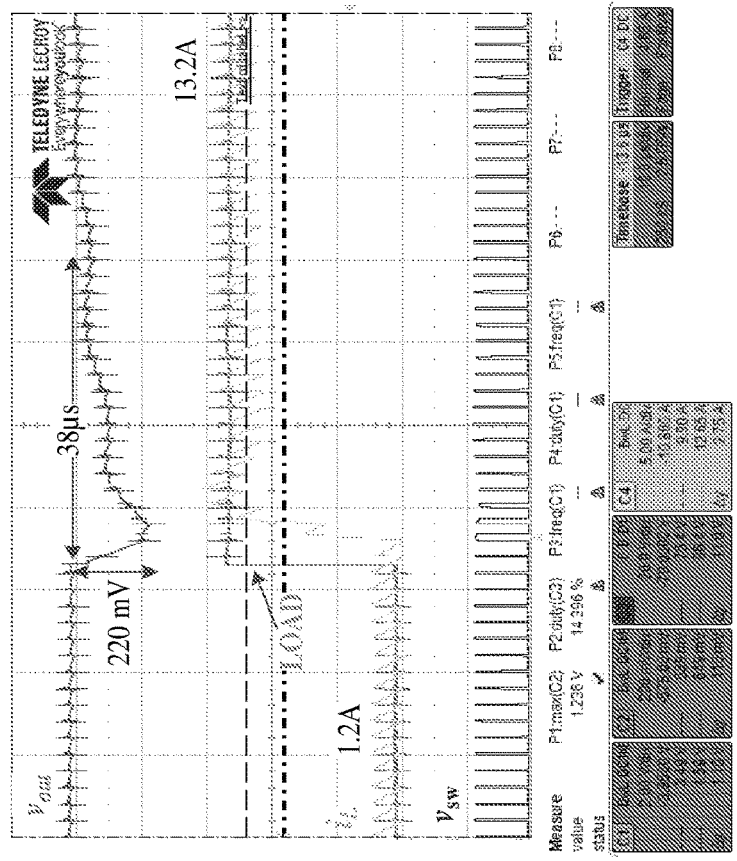
FIG. 31

DIGITAL AVERAGE CURRENT-MODE CONTROL VOLTAGE REGULATOR AND A METHOD FOR TUNING COMPENSATION COEFFICIENTS THEREOF

FIELD OF THE INVENTION

The present invention relates to the field of voltage regulator circuits. More particularly, the invention relates to a fully digital voltage regulator controlled by an average current-mode controller.

BACKGROUND OF THE INVENTION

Following the rapid growth in computing power and in particular for portable electronics, the specifications and restrictions on the power delivery have been significantly tighten to assure compact, light, energy efficient, and economical power sources. Efforts to accommodate these challenges range from the selection of the power devices, frequency of operation, through new topologies for switch-mode power supplies (SMPS), controller types and others. In recent years, the technology for on-chip integration of a power device with its controller and further advancements for co-packaging of reactive components (e.g. inductors, capacitors) have enabled a new generation of compact, efficient and economical Voltage Regulator Modules (VRMs).

In the worldwide trend of integration, digital design is predominant with several advantages such as convenience of the design, flexibility, scalability, and potential performance improvements. However, in power electronics and particularly in VRM applications, analog-oriented integration and analog controllers lead the trend. The main reason for use of analog components is that wide control bandwidth can be obtained without a significant penalty in the die area or power consumption. In order for a digital controller to be attractive and compete with an analog one, a low supply voltage process is preferred. This however introduces a tradeoff for a monolithic design, where die area for power devices is rather large, especially for inputs that are over 5V. The main limiting factor of digital technology in integrated power processing applications is therefore that controller architectures have not been optimized to the operation of the SMPS, but uses rather generalized cores to execute very specific tasks. It would be extremely beneficial if a digital controller would be specifically tailored to the set of tasks required by the SMPS and realized through a simple digital design flow, with competitive sizing, on a similar process of the power devices.

It is therefore an object of present invention to provide architecture of a fully digital of a VR controller.

It is another object of the present invention to provide a fully digital auto-tuning ACM controller that follows the classical two-loop ACM design with an all-digital outer voltage and inner current loops.

Other objects and advantages of this invention will become apparent as the description proceeds.

SUMMARY OF THE INVENTION

The present invention is directed to a digital controller for controlling an average-current-mode voltage regulator having an output connected to a load. Preferably, the controller comprises:
a. a digital voltage-sampling window Analog-to-Digital Converter (ADC), based on Delay-Lines (DLs) and configured to obtain a sample of a voltage error signal being the difference between the reference voltage and the output voltage, and to convert the voltage error signal from analog to digital representation;
b. a digital current-sampling window ADC, based on DLs and configured to obtain a sample of the output current and to convert the current output from analog to digital representation;
c. a digital compensator for voltage regulation, receiving as input the digital voltage error signal, configured to generate a current reference signal based thereupon;
d. a digital compensator for current regulation, receiving as input the current error signal and the current reference signal, configured to generate a duty-ratio command signal based thereupon; and
e. a digital hybrid High Resolution (HR) Digital Pulse Width Modulator (HR-DPWM) receiving as input the duty-ratio command signal and generating a pulse-width-modulated signal that is fed to the gates of the converter's transistors, to thereby control the current and voltage supplied to the load.

The controller may be implemented using standard CMOS components.

The digital voltage-sampling window ADC and the digital current-sampling window ADC may be a single digital window ADC based on DLs and may further comprise an input multiplexer (MUX) and an output de-multiplexer for switching between voltage and current sampling.

The digital voltage-sampling window ADC and the digital current-sampling window ADC may be based on standard-cell technology with no modifications.

The digital current reference compensator and the digital duty-ratio reference compensator may be first order compensators.

In one aspect, the HR-DPWM comprises:
a) a coarse-counting block comprising a delayed clock-chain, the block receiving as input a reference clock and a first portion of bits from the duty-ratio command signal, and generating, by the delayed clock-chain, a time-base signal and a coarse-delayed version of the time-base signal;
b) a fine-counting block comprising a delay-line, the block receiving as input the delayed version of the time-base signal and a second portion of bits from the duty-ratio command signal, and generating, by the delay-line, a high-resolution delayed signal; and
c) a logic block receiving as input the Most Significant Bit (MSB) of the duty-ratio command signal, the time-base signal, and the high-resolution delayed signal; and generating the pulse-width-modulated signal that controls the gates of the transistors, wherein the MSB of the duty-ratio command signal serves as a selector between a pulse-width-modulated signal with duty cycle higher than 0.5 and a pulse-width-modulated signal with duty cycle lower than 0.5.

The controller may further comprise:
a. a reference pulse generator, configured to convert the current reference signal into an adaptive reference pulse, thereby allowing the digital voltage-sampling Delay-Line based window Analog-to-Digital Converter (DL-ADC) to be used for its full load range; or
b. a segmented-reference generator configured to split the current reference signal to two portions, the first portion used for coarse-tuning the reference pulse, the second portion used as an offset to be subtracted from the current-sampling DL ADC's output so as to fine-tune the current error signal.

The present invention is also directed to a digital average-current-mode voltage regulator with an output connected to a load, and controlled by a controller, where the controller comprises:
  a. a digital voltage-sampling window analog-to-digital converter (ADC), based on delay-lines (DLs) and configured to obtain a sample of the difference between the reference voltage and the output voltage (voltage error signal), and to convert the voltage error signal from analog to digital;
  b. a digital current-sampling window ADC, based on DLs and configured to obtain a sample of the output current and to convert the output current from analog to digital;
  c. a digital compensator for voltage regulation, receiving as input the digital voltage error signal, configured to generate a current reference signal based thereupon;
  d. a digital compensator for voltage regulation, receiving as input the current error signal and the current reference signal, configured to generate a duty-ratio command signal based thereupon; and
  e. a digital hybrid high resolution (HR) digital pulse width modulator (DPWM) receiving as input the duty-ratio command signal and generating a pulse-width-modulated signal that is fed to the gates of the converter's transistors to thereby control the current and voltage supplied to the load.

The digital voltage-loop compensator and the digital current-loop compensator may be auto-tuned in an auto tuning process, comprising the steps of:
  a) defining a default set of coefficients either according to an initial specification of the output target or to satisfy stability of the controller and its output with low bandwidth that is derived as a fraction of switching frequency;
  b) loading the default set of coefficients to the compensators;
  c) extracting coefficients for the digital current-loop compensator from measurements of the output voltage and from the inductor current ripple;
  d) driving a small current step from the digital current-loop compensator to the voltage output and perturb its voltage; and
  e) estimate, from the effect of output capacitor's capacitance to a current perturbation, information required to set coefficients of the digital voltage-loop compensator.

The auto-tuning process may be activated upon power-up.

The controller may comprise an outer voltage loop and an inner current loop, which may have different bandwidths.

Whenever the loops are decoupled, each loop may regulated using a single state-variable.

The auto-tuning process may be performed by:
  a) extracting coefficient for the current loop from the inductor's current ripple by sampling twice per switching cycle; and
  b) extracting of the coefficients of the voltage loop, using the inner current loop as a current source.

BRIEF DESCRIPTION OF THE DRAWINGS

In the drawings:

FIG. 6A shows an architecture of a 6-bit window delay line (DL) ADC according to an embodiment of the present invention;

FIG. 6B shows a schematic diagram of the one-shot timer of the ADC of FIG. 6A;

FIG. 6C shows a timing diagram of the inputs and output of the AND operator of the ADC of FIG. 6A;

FIG. 6D shows a diagram, equivalent to the subtraction inherently included in the ADC of FIG. 6A;

FIG. 26 shows zoomed-in view of 0 FIG. 25 expanding Stage II—extraction of the inner (current) loop compensator. Output voltage $v_{out}(t)$ (top) and inductor current $i_L(t)$ (bottom). Measurements of the output voltage $v_{out}(t)$ and inductor current $i_L(t)$ during stage II;

FIG. 27 shows time domain simulation results of 6 A transient events at the end of the auto-tuning procedure. (a) Unloading, (b) Loading;

FIG. 31 shows experimental load steps of 12 A with 1 µH inductor and 150 µF ceramic output capacitor ($v_{out}$ 200 mV/div, $i_L$ 5 A/div, $V_{sw}$ 20V/div, time scale is 10 µs/div).

DETAILED DESCRIPTION OF THE INVENTION

Reference will now be made to an embodiment of the present invention, examples of which are illustrated in the accompanying figures for purposes of illustration only. One skilled in the art will readily recognize from the following description that alternative embodiments of the structures and methods illustrated herein may be employed, mutatis mutandis, without departing from the principles of the claimed invention.

Figure 1:
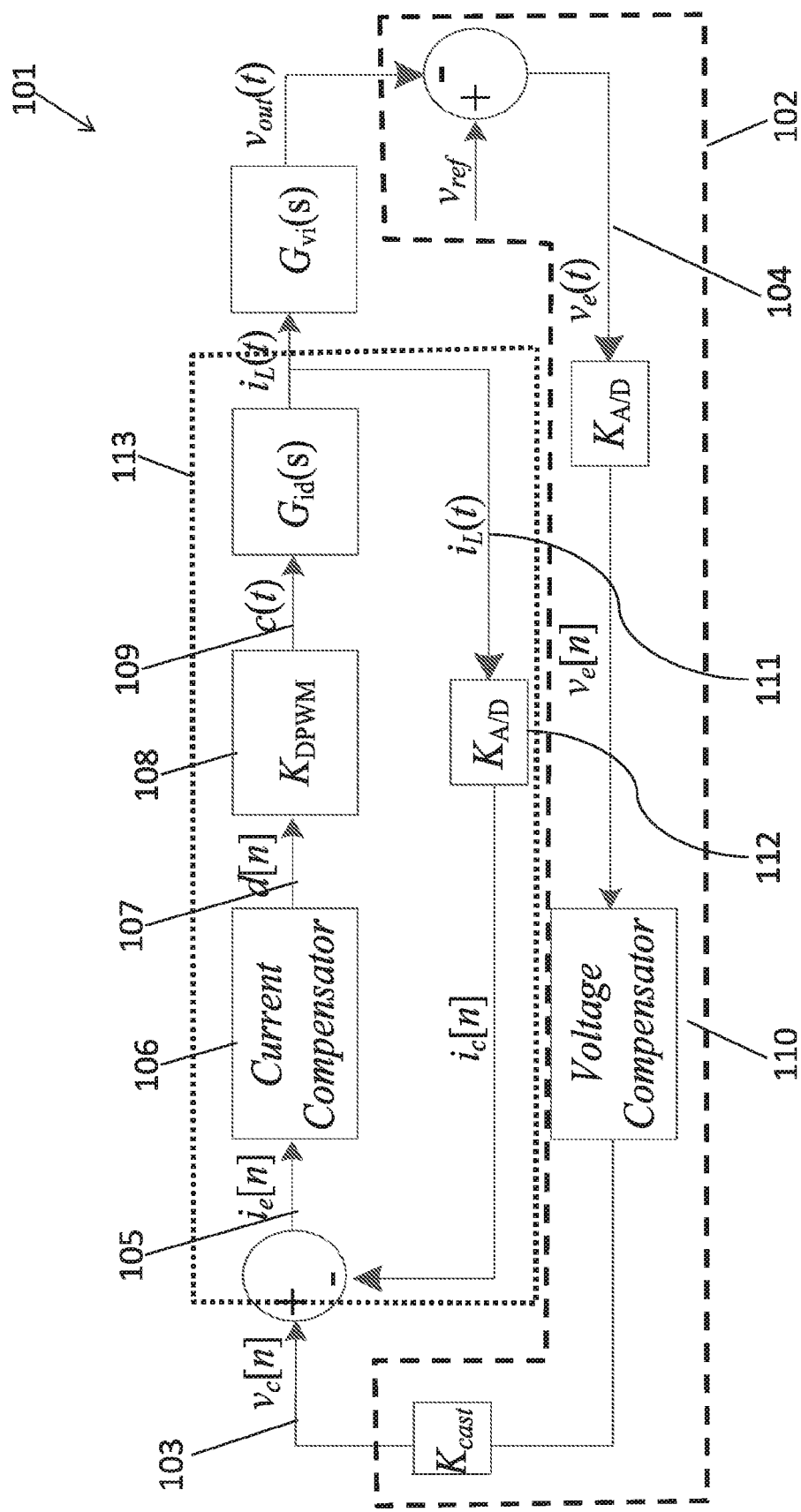
FIG. 1 (prior art) schematically illustrates a conceptual block diagram of an Average Current-Mode (ACM) controller.
Figure 2:
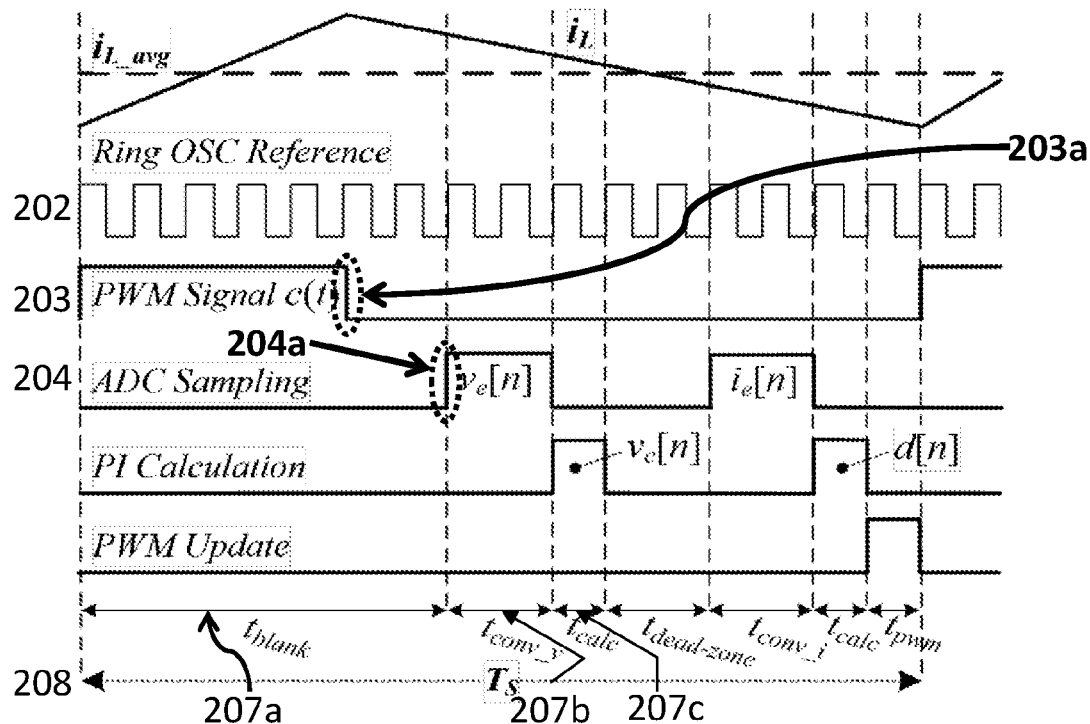
FIG. 2 shows a fundamental timing diagram of the controller of FIG. 1.

FIG. 1 (prior art) schematically illustrates a conceptual block diagram of a common Average Current-Mode (ACM) controller 101. FIG. 2 (prior art) shows a fundamental timing diagram of controller 101. Controller 101 follows the classical two-loop ACM design with outer voltage loop 102 and inner current loop 110. The voltage loop 102 creates a digital reference $v_c[n]$ (numeric 103) based on the error signal 104 of the voltage loop 102, for the average current value. The current error signal $i_e[n]$ (105) is the input to a current loop compensator 106 that generates the duty-command d[n]107 which is then sent to the DPWM 108, and a pulse width a modulated signal c(t) (109) is created.

Digital ACM controllers present significant advantages over Peak Current-Mode (PCM) controllers such as drastically reduced resources and simplified design due to the fact that the required sampling rate of an ACM controller is in the order of the switching frequency (as oppose to the high frequency required by PCM controllers in order to efficiently sample current peaks).

Moreover, with the evolution of technology, e.g. the rise in popularity of integrated Voltage Regulator Modules (VRMs), the recent evolution of methods for on-the-fly efficiency optimization and current sharing for multiphase stages, where the information of the average current is essential, the advantages of ACM control approach over Peak Current Mode (PCM) control approach are becoming more apparent. Especially noticed is a case in which an ACM module can be realized without any additional hardware.

Furthermore, in ACM approach some of the building blocks are identical for both the voltage and current loops, and therefore by using the same hardware a significant reduction of the resources is achievable. For example, using the same ADC for sampling both voltage and current is an attractive attribute to save die area, lower power consumption and to reduce the complexity of the design. Therefore the controller of the present invention uses the same hardware for sampling of both the output voltage and the inductor current.

As detailed below, each of the fundamental units of controller 101 are implemented as asynchronous (combinatorial) hardware, using Delay Lines (DLs) and combinatorial circuits. By doing so, a significant portion of complex and power-hungry hardware for timing and high-speed synchronization is eliminated. However, since DPWM is a synchronized process, a system governor is employed to provide time-base to the switching cycle and trigger the sequential operation of the functional blocks within the switching cycle. As can be seen in FIG. 2, the DPWM signal 203 is sectioned into 16 equal intervals per switching period 208, based on an internal ring oscillator (wave 202). According to an embodiment of the invention, the system governor also provides a programmable frequency selection by the number of intervals per switching period.

To facilitate sampling with high signal-to-noise ratio, the sampling event (e.g. 204a) is triggered sufficiently away from the switching action (e.g. 203a). Within the context of VRMs, the "on" time (i.e. the portion of a signal PWM cycle in which a high signal is generated) constitutes a relatively small portion of the switching period, allowing noise-clean sampling throughout most of the cycle duration. According to an embodiment of the invention, given a target conversion ratio, a blanking time window $t_{blank}$ 207a is set from the beginning of the cycle to the timing of trigger action 204a of sampling the output voltage. Following a short period of $t_{conv\_v}$ 207b to allow conversion of the ADC, a sample of the output voltage is obtained and a digital error signal $v_e[n]$ (numeric 102 in FIG. 1) is generated. In the following interval $t_{calc}$ 207c, the current-reference signal $v_c[n]$ (numeric 103 in FIG. 1) is calculated by the voltage compensator (numeric 110 in FIG. 1).

It should be further emphasized that in the case of a load transient event, or other circumstances that may lead to a significant increment of the on time beyond $t_{blank}$, the sampling instance 204a may slide onto the switching action 203a. This undesirable case can result in an incorrect or noisy sampling. In order to overcome this, according to an embodiment of the present invention, dual-edge modulation is used which provides relatively fast transients response.

Figure 3:
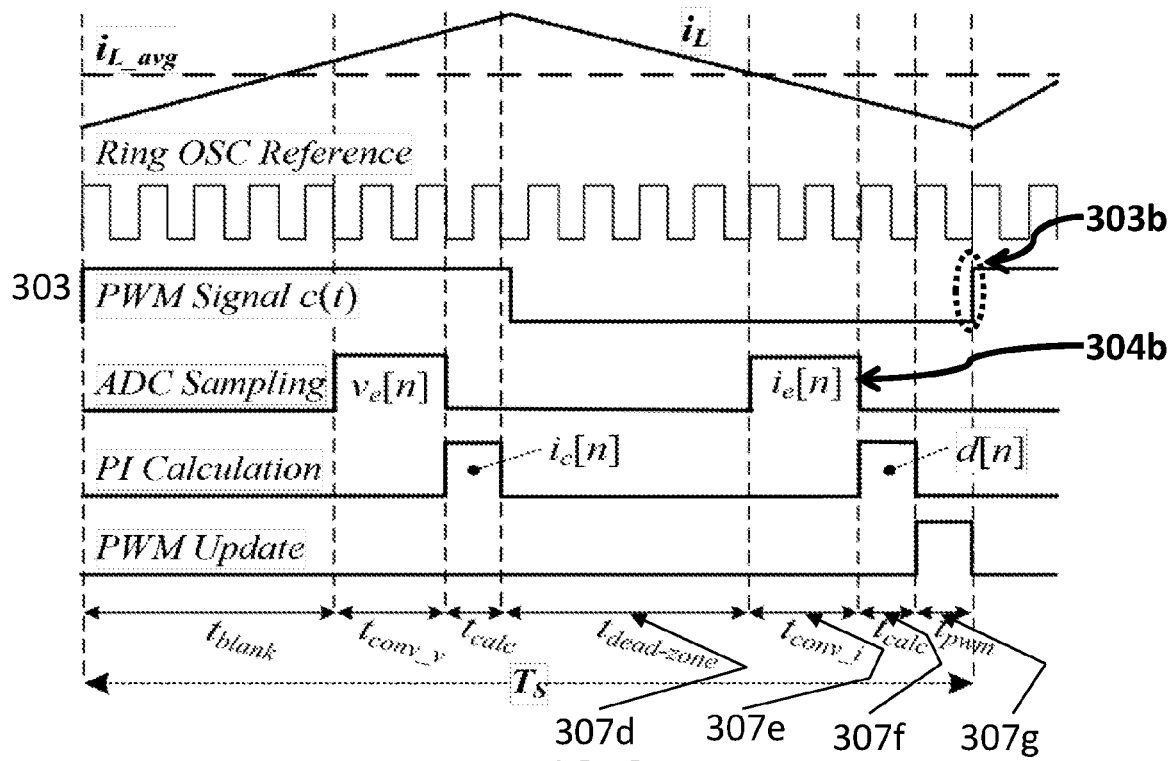
FIG. 3 shows a timing diagram of a controller with an adaptive trimming of the blanking time window.

According to another embodiment of the invention, in order to guarantee that the sampling event will not occur in the vicinity of the switching action a programmable blanking period is used. FIG. 3 shows a timing diagram of a controller with an adaptive trimming of $t_{blank}$. In this embodiment, the hardware of controller is equipped with the possibility to set the blanking time based on loaded information on startup through the SPI periphery.

Referring back to FIG. 1, since the same ADC hardware is used for sampling of both the output voltage and inductor current, time-multiplexing is employed, in which the input to the ADC is selected by one or more multiplexers (MUXs) either from the voltage output 104 or from the inductor current 111, and the output is sent by one or more demultiplexers either to the voltage compensator 110 or to the current compensator 106, thereby assigning the appropriate signals to the ADC channels.

Sampling of the current takes place during the "off" time (i.e. the portion of a signal PWM cycle in which a low signal is generated) and is preceded by the interval $t_{dead\_zone}$ 307d to allow hardware multiplexers to switch between the ADC channels. Following a similar conversion interval $t_{conv\_i}$ 307*e*, a current error $i_e[n]$ 304*b* is obtained and then the new duty-command d[n] is generated during $t_{calc}$ 307*f* and is ready to be loaded onto the DPWM unit at $t_{pwm}$ 307*g*, before the beginning of the new switching period 303*b*.

It should be noted that average current sensing can be obtained with or without extra filtering of the inductor current. This is since the current information is obtained through one sample per cycle approach, thus filtering out ripple information. It should be further noted that the sampled current information isn't necessarily equal to its average value. This is due to ripples in the inductor current and the location of the sampling with respect to the cycle and the instantaneous duty ratio, which results in an offset of the sampled value from the average. In order to accurately obtain the exact average value, many parameters are required by the controller, which significantly complicates its implementation. Moreover, there is no apparent benefit, in terms of the regulation capability, from knowing the exact average value. The control scheme uses two control loops for current and output voltage, and as a result any offset in the current sample is compensated by the voltage loop 102.

Figure 4:
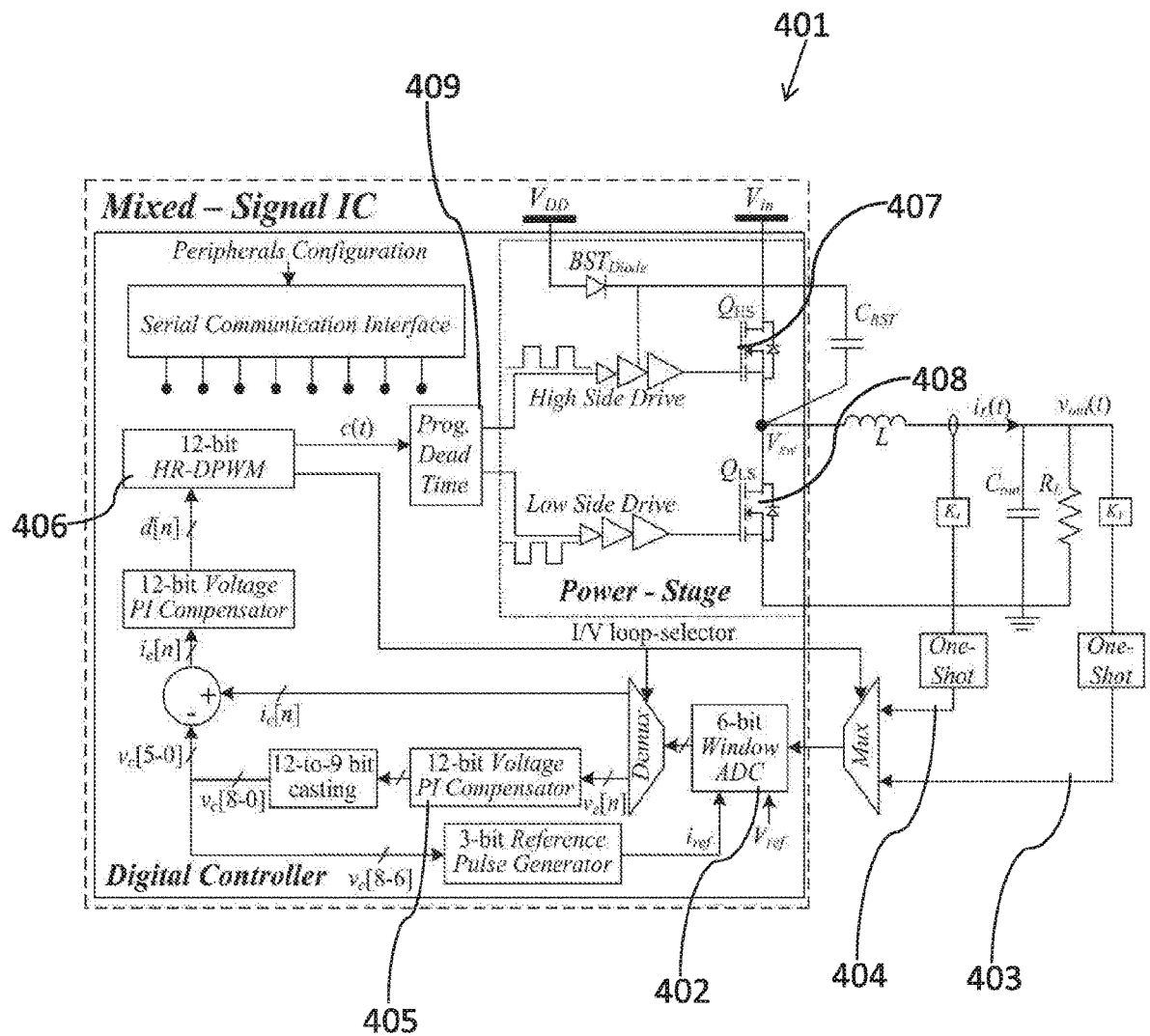
FIG. 4 schematically illustrates a circuit diagram of a digital ACM controller according to an embodiment of the present invention.

FIG. 4 schematically illustrates a circuit diagram of a digital ACM controller 401 according to an embodiment of the present invention. The realization of controller 401 relies on three key building blocks:
1) a dual-channel 6-bit DL-based window ADC 402 configured to obtain a sample of both the output voltage 403 and inductor current 404 (such an ADC is described in WO 2015/177786).
2) a 12-bit PI compensator 405 generating the current reference $v_c[n]$ and duty-ratio command d[n] signals; and
3) a 12-bit hybrid High Resolution (HR) DPWM 406 that generates the gate drive signals for the power transistors QHS and QLS with a programmable dead-time option, as will be explained below.

In the following section it is assumed, without loss of generality, that the system 401's parameters are known or can be extracted or measured, i.e., information available on: the input voltage $V_{in}$, output voltage $V_{out}$, output capacitance $C_{out}$, inductor L and its DC resistance $R_{DCR}$, the nominal load current $I_{out}$, and the peripherals units gains.

Window Delay-Line (DL)-ADC

To achieve good regulation accuracy, a reliable sensing of the state-variables is essential. In the digital domain, this requirement translates into a relatively high-resolution measurement around the operating point. According to an embodiment of the present invention, this is facilitated by a window, where a small quantizer around the target point provides an accurate measurement with modest hardware. By doing so, the size is significantly reduced, but more importantly, many of the full span linearity concerns of full-scale ADCs are removed. According to an embodiment of the invention, the window-ADC is developed on the basis of standard-cell technology without any modifications.

The on-chip ADC, quantizes the difference between the sampled signal of $v_{out}(t)$ or $i_L(t)$ and an internal reference $V_{ref}$ or $i_{ref}$, respectively. FIG. 6A shows the architecture of a 6-bit window DL-ADC according to an embodiment of the present invention, which follows a two-step conversion: a voltage-to-time conversion using a one-shot timer 602, followed by time-to-digital conversion using a DL built of a string of digital buffers 603 with fixed propagation time. FIG. 6B shows a schematic diagram of the one-shot timer 602, whereas the RC timing network is implemented off-chip. As can be observed, the one-shot timer 602 comprises two input signals: a first input, $V_{TRG}$, is connected to the NOR operator 604 and is used to trigger a timed output pulse, $V_{INV}$. The second input receives the continuous-time (analog) sampled signal [$v_{out}(t)$ or $i_L(t)$] to be used as the bias-voltage for the RC timing network. Under steady-state conditions, $V_{TRG}$ is low and the output of the NOR ($V_C1$) is high, thus the voltage node $V_C2$ is pulled-high through the resistor R up to the sampled signal level.

As a result, timed output pulse of the one-shot, $V_{INV}$, is pulled-down to ground. Once the input trigger $V_{TRG}$ is high, both $V_C1$ and $V_C2$ discharge to ground, and as a result $V_{INV}$ goes high. Due to the feedback between the output and input of the one-shot 602, the NOR operator 604 holds $V_C1$ low. After the triggering event, the system settles down to steady-state, as the voltage at node $V_C2$ pulled-high since the capacitor C is now charged through R. The one-shot timer 602 generates an output pulse, the duration of which is inversely proportional to the amplitude of sampled signal. The relationship between the generated pulse-length, $T_{pulse}$ and the analog input signal can be expressed by Eq. 1, where $V_{dd}$ and $V_{th}$ are the logic and threshold voltages, respectively, and $V_{sample}$ is the value of the sampled signal [$v_{out}(t)$ or $i_L(t)$].

$$T_{pulse} = RC*\ln\left(\frac{V_{dd}}{V_{sample} - V_{th}}\right) \qquad \text{Eq. 1}$$

By inserting the inversed one-shot output (sampled signal) and the reference pulse to an AND operator 605, a short pulse that represents the time difference between the pulses is obtained. FIG. 6C shows a timing diagram of the inputs and output of AND operator 605. The duration of a differential pulse 606 is calculated by the DL string to quantify the difference between the sampled signal and a reference value. At the end of the conversion, the differential pulse triggers the DL status register, which in turn latches synchronously with respect to falling edge of the differential pulse. The residual time is captured as a thermometer code and then translated to a binary value.

This implementation for a window ADC inherently includes subtraction between a sampled signal and a reference signal, as demonstrated in the equivalent diagram shown in FIG. 6D. Therefore, no additional hardware is required to subtract the sampled signal from the reference signal and the difference is directly quantized. In addition, since the differential pulse is significantly shorter than the one-shot or reference pulses, a shorter DL string is required and it is independent of the pulses total duration.

Voltage and Current Compensators Design

As in any classical two-loop control method for PWM converters in which the effect of the state-variables can be decoupled, the computational effort and the hardware complexity of the compensators 106 and 110 can be reduced to a first order system, resulting in PI-type compensation scheme. As mentioned above, a major benefit of digital ACM control is the potential hardware sharing. Therefore, according to an embodiment of the present invention, a digital PI compensator has been realized for both the voltage and current loops with shared hardware (multiplier) on the basis of one-sample-per-cycle. A simple hardware realization can be achieved, resulting in reduced power consumption and die area. Taking into account a sampling delay of one switching cycle, the compensator can be expressed by Eq. 1 (with reference to FIG. 1), where a and b are the compensator's coefficients.

$$v_c[n] = v_c[n-1] + av_e[n] - bv_e[n-1] \qquad \text{Eq. 2}$$

Applying a conservative compensation design to assure stability with reasonable dynamics and under the assumption that the inner loop is with a higher bandwidth than the outer loop, the coefficients can be calculated according to Eq. 3 where $T_i$ is the integrator time constant which determines the compensator's zero, i.e. $T_i=1/2\pi f_0$, and $k_p$ is the compensator's proportional gain.

$$a=k_p; b=k_p(1-T_s/T_i) \qquad \text{Eq. 3}$$

The compensator's coefficients are set so that the closed-loop goals for each loop are achieved for both phase margin and control bandwidth. The controller gain with respect to the control-to-output response of the loop determines the bandwidth while the location of the PI's zero controls the phase margin. To satisfy stability with prescribed phase margin $\varphi_m$, the frequency of the compensator's zero $f_0$ is set using Eq. 4.

$$f_0 = f_c \sqrt{\frac{1-\sin(\varphi_m)}{1+\sin(\varphi_m)}} = \frac{1}{2\pi T_i} \qquad \text{Eq. 4}$$

The control bandwidth is determined by setting the proportional gain $k_p$ as the gain value at the target crossover frequency $f_c$ for each loop, i.e. the gain values of $k_{pI}$ and $k_{pV}$ are inversely proportional to the overall gain of the inner current and outer voltage loops, respectively. With the aid of FIG. 1 current compensator 106's proportional gain $k_{pI}$ can be found using Eq. 5, where $K_I$ is the gain due to the current sensing, $K_{A/D}$ and $K_{DPWM}$ are the gains of the peripheral units 112 and 108 of the current loop 113, respectively, and $G_{id}(s)$ is the control-to-output transfer function of the inner current loop.

$$k_{pI} = \frac{1}{G_{id}(s)K_I K_{A/d} K_{DPWM}} \qquad \text{Eq. 5}$$

For buck converter $G_{id}$ is given by Eq. 6 where $V_{in}$ is the input voltage, L is the inductor value, and $R_{DCR}$ is the DC resistance of the inductor.

$$G_{id}(s) = \frac{i_L(s)}{d(s)} = \frac{V_{in}}{sL+R_{DCR}} \qquad \text{Eq. 6}$$

By substituting Eq. 6 into Eq. 5, and setting $s=2\pi f_{cI}$ at the target crossover frequency of the current loop, Eq. 5 can be rewritten as Eq. 7.

$$k_{pI} = \frac{2\pi f_{cI} L + R_{DCR}}{V_{in} K_I K_{A/D} K_{DPWM}} \qquad \text{Eq. 7}$$

In a similar manner to current compensator 106, with the aid of FIG. 1 voltage compensator 110's proportional gain $k_{pV}$ can be found by Eq. 8, where $K_V$ is the gain due to the voltage divider on the output voltage, and $K_{cast}$ is the gain due to the matching between the number of bits of voltage compensator 110 and the accumulator.

$$k_{pV} = \frac{1}{G_{vi}(s)K_V K_{A/D} K_{cast} \frac{1}{K_I K_{A/D}}} \qquad \text{Eq. 8}$$

$G_{vi}(s)$ is the control-to-output transfer function of the outer voltage loop 102, given by Eq. 8, where $R_L$ is the load resistance and $R_{ESR}$ is the equivalent series resistance of the output capacitor $C_{out}$.

$$G_{vi}(s) = \frac{v_{out}(s)}{v_c(s)} = R_L \frac{sC_{out}R_{ESR}+1}{sC_{out}R_L+1} \qquad \text{Eq. 9}$$

Figure 5A:
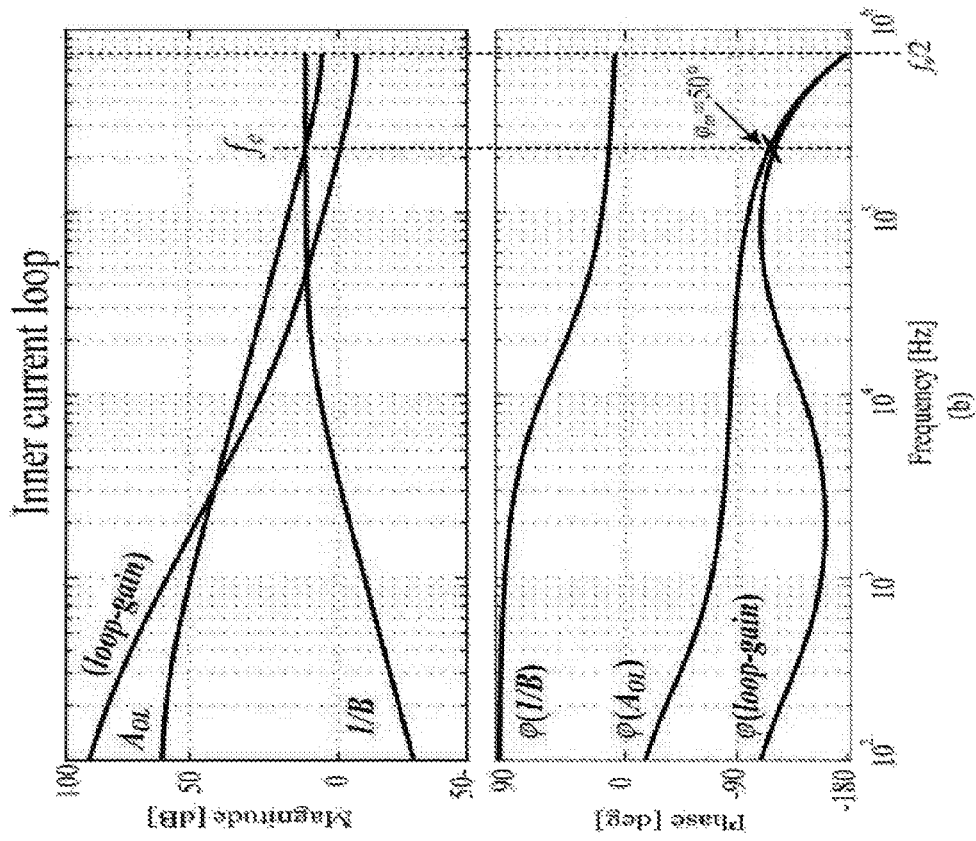
FIG. 5A shows simulation results for the frequency response of the outer voltage loop of the controller of FIG. 1.
Figure 5B:
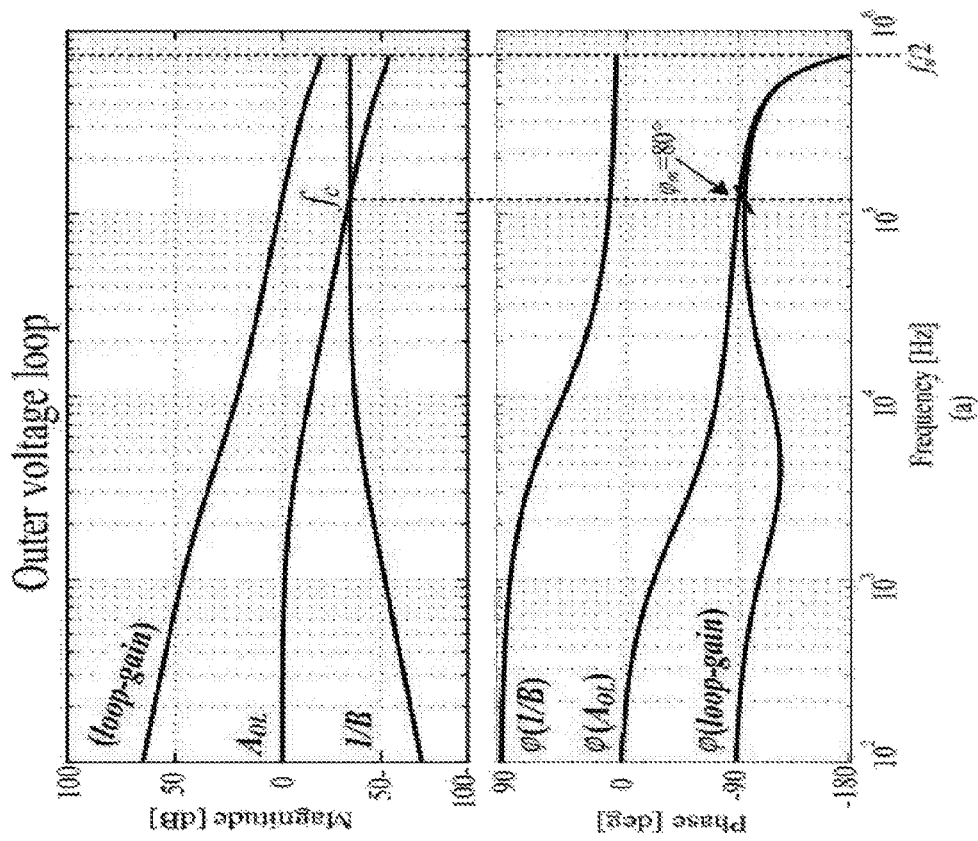
FIG. 5B shows simulation results for the frequency response of the inner current loop of the controller of FIG. 1.

The design of compensators 110 and 106, prior to the implementation, can be validated through simulations as a complete closed-loop system with, for instance, a 12V-to-1.5V buck converter 110 at a nominal output current of 1.5 A, operating at 1.25 MHz where L=2.2 pH and $C_{out}$=50 µF ($R_{DCR}$=10 mΩ); $R_{ESR}$=2 mΩ). Exemplary target closed-loop parameters are, for instance: for the inner (current) loop 113 a crossover frequency of 250 kHz and phase margin of approximately 50° whereas for the outer (voltage) loop 102 a crossover frequency of 120 kHz with phase margin of 80°. Simulation results for the frequency responses of both loops with the above exemplary parameters are depicted in FIG. 5A and FIG. 5B. It should be emphasized that the frequency responses shown in FIGS. 5A and 5B are for a discrete-time representation of the control-to-output transfer functions. According to an embodiment of the invention, a single-sample per cycle as well as computation delays may be alternatively used.

The procedure of extracting coefficient values based on the exact information of the converter's control-to-output response can be based, according to an embodiment of the present invention, on an auto-tuning algorithm detailed by Vekslender et al in "Hardware efficient digital auto-tuning average current-mode controller," *IEEE Workshop on Control and Modeling for Power Electronics (COMPEL)*, July 2017. Following the above analysis and observations, the discrete-time compensators coefficients have been found to be:

for the current loop 113: $a_I$=0.24; $b_I$=0.2069
for the voltage loop 102: $a_V$=39.27; $b_V$=34.34

Since the final IC should function as a stand-alone device, compensators 106 and 110's hardware architecture includes a small volatile memory, as a part of a serial communication interface (e.g. SPI) that is preprogrammed with a set of default values for the coefficients a and b according to the found coefficients. On startup, the default coefficients' values can be used or a new set of coefficients can be loaded to the controller through the SPI. Then, the SPI internally communicates with compensator units 160 and 110 and loads the set of values per compensation loop. A benefit of this embedded feature is that the same controller hardware can be used with different power-stage configurations and parameters. Another reason for this feature is to support future development steps of online auto-tuning and adaptive control.

Auto Tuning of Compensator Coefficients

The design of loops 102 and 113 (of FIG. 1) with significantly different bandwidths, i.e. providing a current loop with a wider bandwidth than the voltage loop, simplifies the compensators 110 and 106's structures, and a simple PI scheme can be used for both current and voltage loops' compensators. Since each of the loops is tightly regulated using a single state-variable, decoupling of the loops can be assumed, i.e. the coefficients for each controller can be extracted independently and further adjusted without significantly affecting the operation of the other loop.

According to an embodiment of the invention, an auto-tuning procedure of the compensators 110 and 106's coefficients is applied. The aim of the auto-tuning is to extract the compensators' parameters to achieve tight output voltage regulation as well as stability over wide range of L and $C_{out}$ values. More precisely, the performance goals of the auto-tuning are specified to satisfy: a) a minimal phase margin of 45° for both loops; b) control bandwidth as high as possible, derived as a fraction the switching frequency under the assumption that the current loop has higher bandwidth as the voltage loop; and c) the output voltage is kept within specified margins.

To assure that stability is achieved within all corners of the variations that define the operation range, "artificial" tolerances are added to the design procedure. That is, although a single set of coefficients can achieve the target goal per specified plant, stability verification is embedded in the algorithm to cover the full range that is specified. Naturally, this implies that the dynamic response is optimized to one set of values and would deviate from that point for other values, but as long as the values are within the tolerance range that has been assumed, stability is maintained.

The auto-tuning procedure is applicable at running mode, but also during start-up, i.e. when $v_{out}$ has not yet reached its nominal value. This means that with the tuning procedure, the controller must also observe and correct $v_{out}$. To this end, a voltage-mode integrator-type compensator of low bandwidth (significantly lower than the target) is initially set on power up and is in charge of ramping up the output voltage, i.e. by slowly increasing the reference $V_{ref}$.

Figure 15:
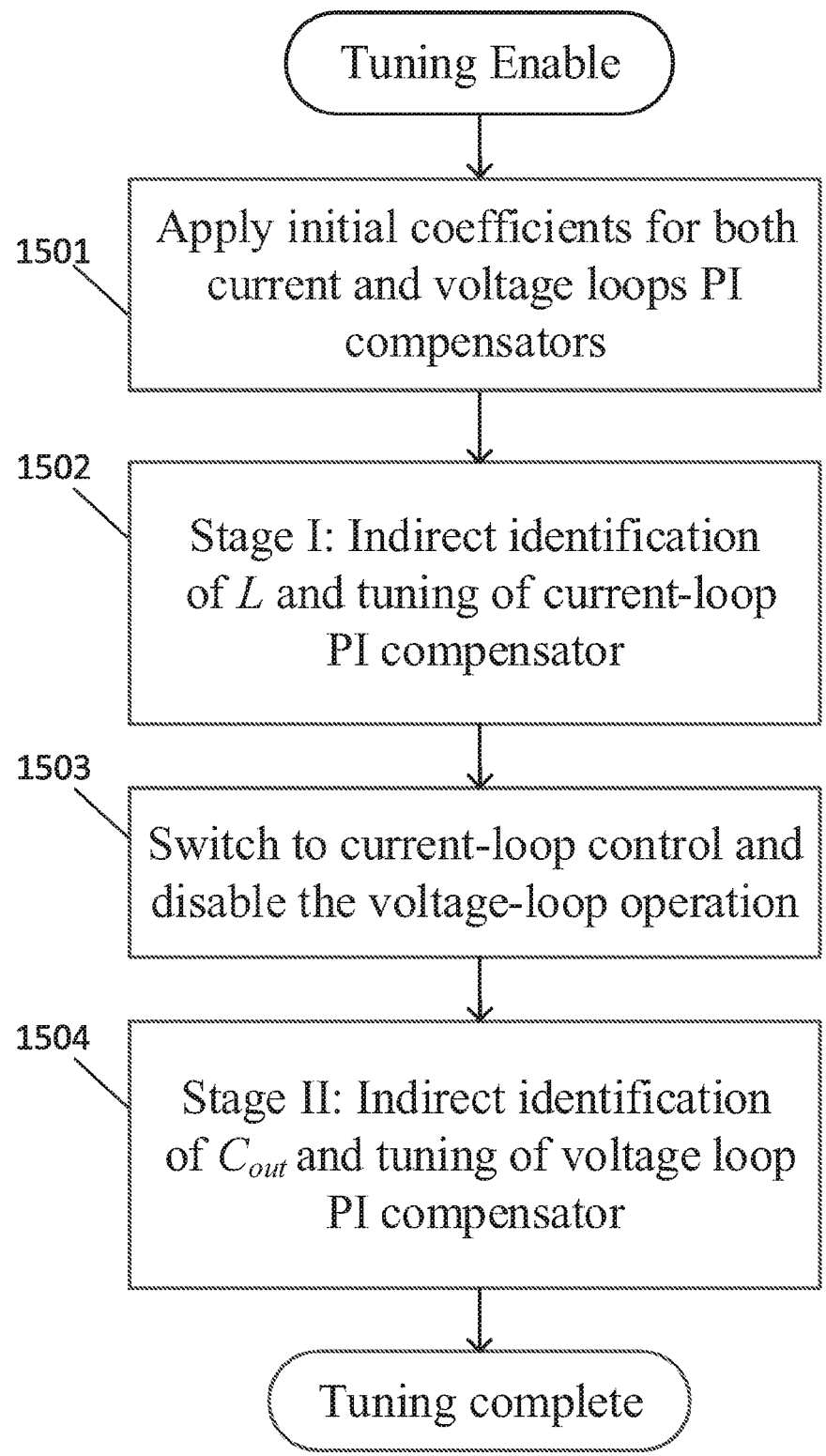
FIG. 15 shows a flowchart of the tuning procedure, according to an embodiment of the invention.

FIG. 15 shows a flowchart of the tuning procedure, according to an embodiment of the invention. When the tuning procedure is initiated 1501, a default set of pre-loaded coefficients are loaded (1502) to both compensators. These can be obtained from the initial specification of the target application. In case no information is available on the system, the values are set to satisfy stability with very low bandwidth that is derived as a fraction of the switching frequency. According to an embodiment of the invention, the tuning operation is conducted per loop. At the next stage 1503, coefficients are extracted for the current loop (113 in FIG. 1). This is performed according to information obtained from the inductor's current ripple on a basis of sampling twice per switching cycle. Effectively, along with the information of the system voltages, the measurement of the inductor current ripple estimates the inductance value, from which compensator 106 may be set with a defined crossover frequency. Once the inner current loop tightly regulates the average value of the inductor current, the system is of first order and stability is satisfied. The next stage 1504 of the tuning process is to achieve the dynamic performance by extraction of the coefficients of the voltage loop. In this stage, the inner current loop is used as a current source to drive a small current step to the output RC network and perturb its voltage from which, in stage 1505, an estimate of the output capacitance provides the required information to set the coefficients of the second compensator 110.

Hybrid High-Resolution (HR) Digital Pulse Width Modulator (DPWM)

In the context of digitally controlled SMPS, HR-DPWM is essential to avoid undesirable limit cycle oscillations. The conventional approach to implement HR-DPWM is by a fast-clocked counter-comparator scheme. In this way, n-bit resolution at a switching frequency of $f_s$ requires a reference clock frequency of $2^n \cdot f_s$. This translates to high power consumption and complex design to realize the high-speed circuitry. Another approach to realize a HR-DPWM is based on tapped DL scheme. In this method, the power consumption is reduced, although the required silicon area of the design grows exponentially with the number of resolution bits. Another potential design challenge of the tapped DL method is the design of the delay elements (DEs).

According to an embodiment of the present invention, a combination of both methods is employed, i.e., by incorporating a coarse-counting block and then fine-tuning it to the target delay. This allows a hybrid design concept that is based on relatively lower operating frequency of the system governor with fine counting asynchronous delay-line. Furthermore, the hybrid HR-DPWM of this embodiment can be implemented by compact standard cells, which enables direct synthesis. In addition, the silicon area as well as power consumption are reduced significantly.

A simplistic way to generate a DPWM signal using a time-delay method requires a phase-detection type operation between a reference signal and a delayed signal. To increase accuracy and reduce the silicon area, the use of short delays (less than half switching cycle) is preferred. An Exclusive-OR (XOR) operator is a simplistic phase detector, with a narrow but sufficient dynamic range of half-cycle (180°), and is therefore an ideal candidate to carry out the task. To accommodate the dynamic range, half-cycle padding is realized based on the duty-ratio command as follows; Assuming a given reference time base $DCC_0$, and a delayed signal $DLY_{Fine}$, the DPWM output for D<0.5, D denoting the duty cycle of $DCC_0$, can be obtained as:

$$D < 0.5 \rightarrow c(t) = \begin{cases} DCC_0 \oplus DLY_{Fine}, & t < T_s/2 \\ '0', & \frac{T_s}{2} \leq t < T_s \end{cases} \Leftrightarrow DCC_0 \& \overline{DLY_{Fine}} \quad \text{Eq. 10}$$

and for D≥0.5 the padding is adjusted as:

$$D \geq 0.5 \rightarrow c(t) = \begin{cases} DCC_0 \oplus DLY_{Fine}, & t < T_s/2 \\ '0', & \frac{T_s}{2} \leq t < T_s \end{cases} \Leftrightarrow DCC_0 | DLY_{Fine} \quad \text{Eq. 11}$$

Figure 7:
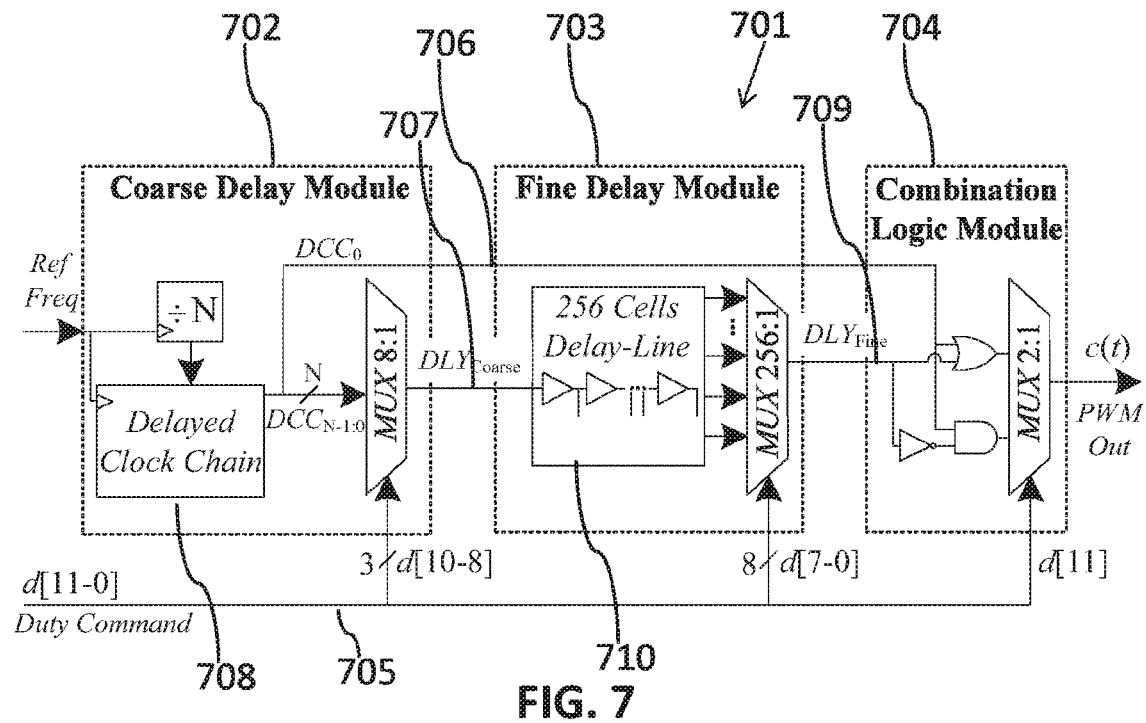
FIG. 7 shows a conceptual architecture for a high resolution digital pulse width modulator (HR-DPWM) unit according to an embodiment of the invention.
Figure 8:
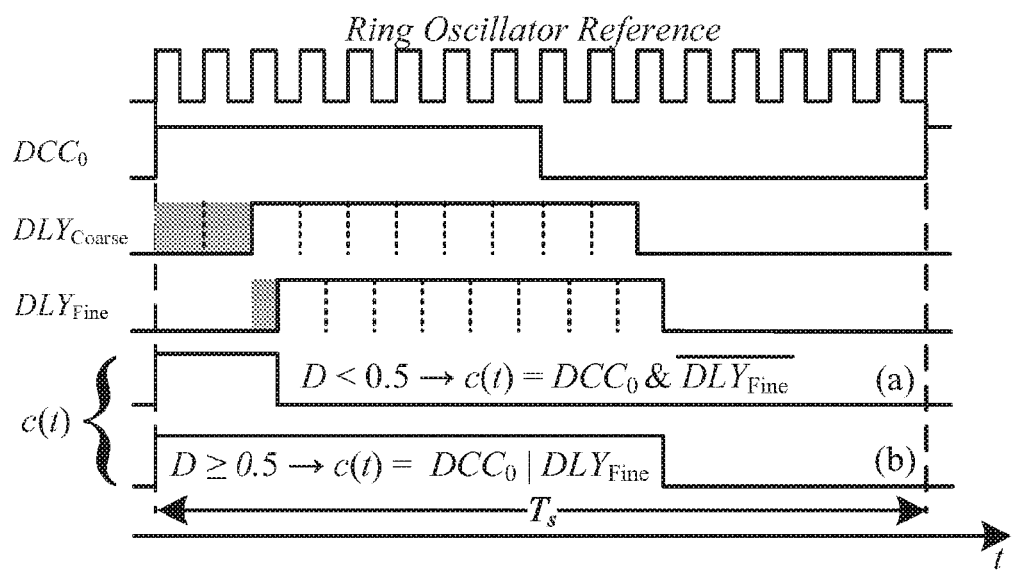
FIG. 8 shows a timing diagram for the HR-DPWM unit of FIG. 7.

From Eq. 10 and 11, the combined logic is simplified to few basic logic operators. FIG. 7 shows a conceptual architecture for an HR-DPWM unit 701 according to an embodiment of the invention. FIG. 8 shows a timing diagram for the HR-DPWM unit of FIG. 7. In order to create a delayed signal from the reference signal with high-resolution, but with simple hardware, a combined coarse-fine digital counter is facilitated, as described in FIGS. 7 and 8. DPWM 701 consists of three functional blocks; a coarse delay module 702, a fine delay module 703, and a logic module 704. The 12-bit digital word for the duty ratio d[11-0] (numeric 705)

is distributed within the three modules. Course delay module 702 is fed by a reference clock (generated by a ring oscillator that is not shown in the Figs.) and 3 bits d[10-8], and generates, by a delayed clock chain 708, two signals: a time-base $DCC_0$ 706, used for the switching period, and a coarse-delayed version 707 of the time-base $DLY_{Coarse}$ with time intervals derived from the reference clock as prescribed by d[10-8]. The fine delay module is a string of 8-bit long DLs 710 that finely adjusts $DLY_{Coarse}$ by the number of DEs as specified by d[7-0], creating the high-resolution delayed signal $DLY_{Fine}$ 709. The logic block applies the required operation of either Eq. 10 or Eq. 11 on $DCC_0$ and $DLY_{Fine}$ based on the Most Significant Bit (MSB) d[11]. The switching frequency of the HR-DPWM 701 can be expressed as function of the number of bits and the propagation time of a single delay element $t_{pd,DE}$ of the fine-delay module as Eq. 12, where N is the number of coarse bits and M is the number of fine bits.

$$f_s = \frac{1}{t_{pd,DE} 2^{N+M}} \quad \text{Eq. 12}$$

Programmable Dead-Time

Figure 9:
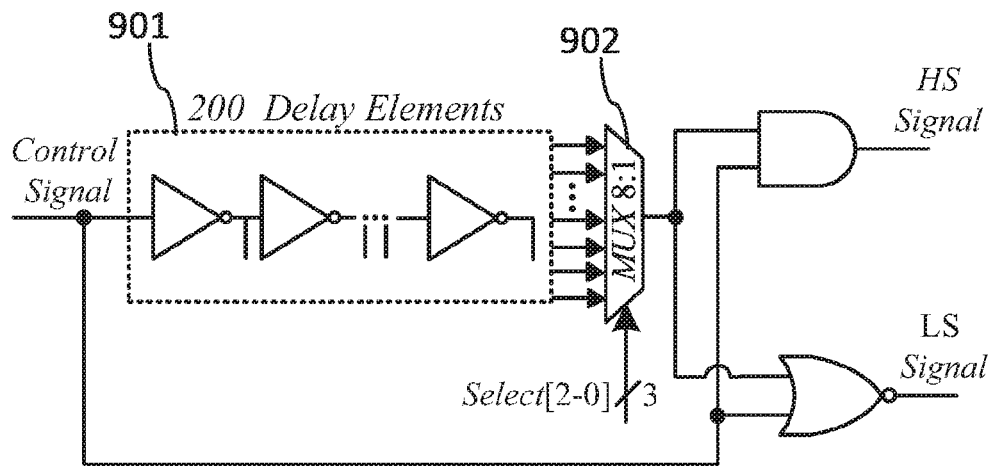
FIG. 9 schematically illustrates a programmable dead-time module according to an embodiment of the present invention.

In order to facilitate switching of power devices without shoot-through, it is necessary to control gate driving signals with proper dead-time, such that the turn on of power transistors $Q_{HS}$ and $Q_{LS}$ (numeric 407 and 408 in FIG. 4) does not overlap. Another important task of an adjustable dead-time unit is to improve the efficiency of the ADC. Therefore, according to an embodiment of the invention, controller 401 further comprises a programmable dead-time module 409, schematically illustrated in FIG. 9, consisting a string 901 of 200 DEs connected to an 8-channel multiplexer 902. In a similar manner to the compensators' coefficients setup, the dead-time $t_{DT}$, set within the SPI memory register with initial default value, and can be programmed from 1 ns up to 40 ns.

Full Load Range Current Compensation Loop

Accurate acquisition of the state-variables by the ADC is a major factor to facilitate a reliable compensation loop. Selection of the type of ADC to be used primarily depends on the compensation type and the set of tasks required. Requirements for accuracy, resolution, dynamic range, acquisition and conversion time may significantly vary with respect to the control scheme. For voltage regulation purposes, aside for a case that requires rapid voltage scaling, a window-based ADC with relatively narrow range is sufficient since the control objective is for regulation around a fixed or slow-changing reference value.

However, the current compensator tracks the inductor current through the entire range of the load (from zero to nominal value) and therefore requires a full-scale and accurate ADC to support the wide variety of loading conditions and fast-changing dynamics. Since a window-type ADC has relatively limited range, its use in the current compensation loop sets a trade-off in either poor current definition for the full load range or high current definition for a narrow load range. Both options are not viable for a high-performance SMPS.

According to an embodiment of the present invention, to exploit the advantages of the window DL-ADC compared to a full-scale ADC, use a window DL-ADC is used to accurately obtain the information of the inductor current for the full load range, with the addition of simple hardware to the current compensation loop. Utilizing this method, a single window DL-ADC unit is used for both the output voltage and inductor current, retaining the all-digital controller realization concept of the controller, and further reducing the overall hardware and silicon area thereof.

The core concept is to generate an adaptive reference value (reference pulse) with respect to the status of the inductor current value, such that the sampling window of the ADC is in the vicinity of the instantaneous inductor current. In current-mode control, the current reference is created by the output of the voltage-loop compensator $v_c[n]$ and provides the required information of the dynamic change that should be performed on the current reference value for the window DL-ADC. The current reference varies with respect to $v_c[n]$, similarly to conventional analog current-mode control.

Figure 10:
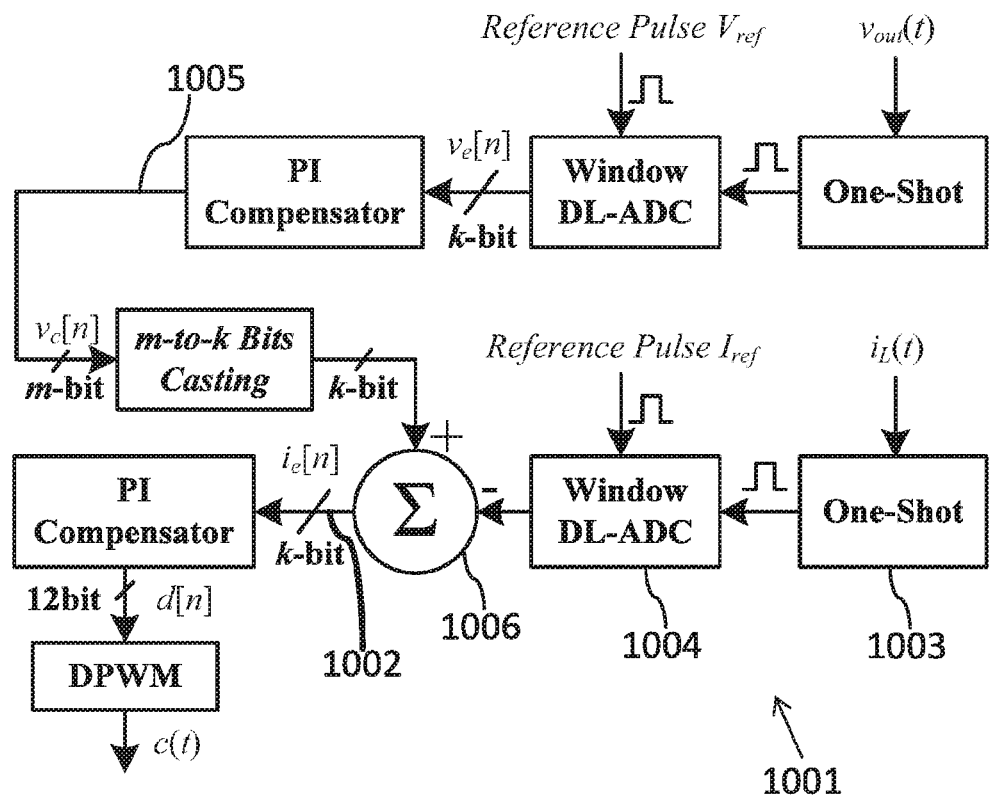
FIG. 10 schematically illustrates a simplified block diagram of the voltage and current compensation loops of a window DL-ADC according to an embodiment of the present invention.

FIG. 10 schematically illustrates a simplified block diagram 1001 of the voltage and current compensation loops of a window DL-ADC with a constant reference value for the voltage and fixed sampling window for the current, according to an embodiment of the present invention. It should be noted that for simplification of the illustration, two window DL-ADC blocks are illustrated, but in the practical realization, one dual-channel window DL-ADC unit can be used, sampling both the output voltage and inductor current. In this embodiment, to calculate the current error $i_e[n]$ 1002, the difference between the inductor current (sampled by 1003) and a constant reference $I_{ref}$ (which represents the fixed offset of the sampling window, calculated by Window DL-ADC 1004) is subtracted from $v_c[n]$ 1005 by 1006 to obtain the current loop reference. As mentioned above, this approach limits the dynamic range of the inductor current due to the limited dynamic range of the conventional window DL-ADC.

Figure 11:
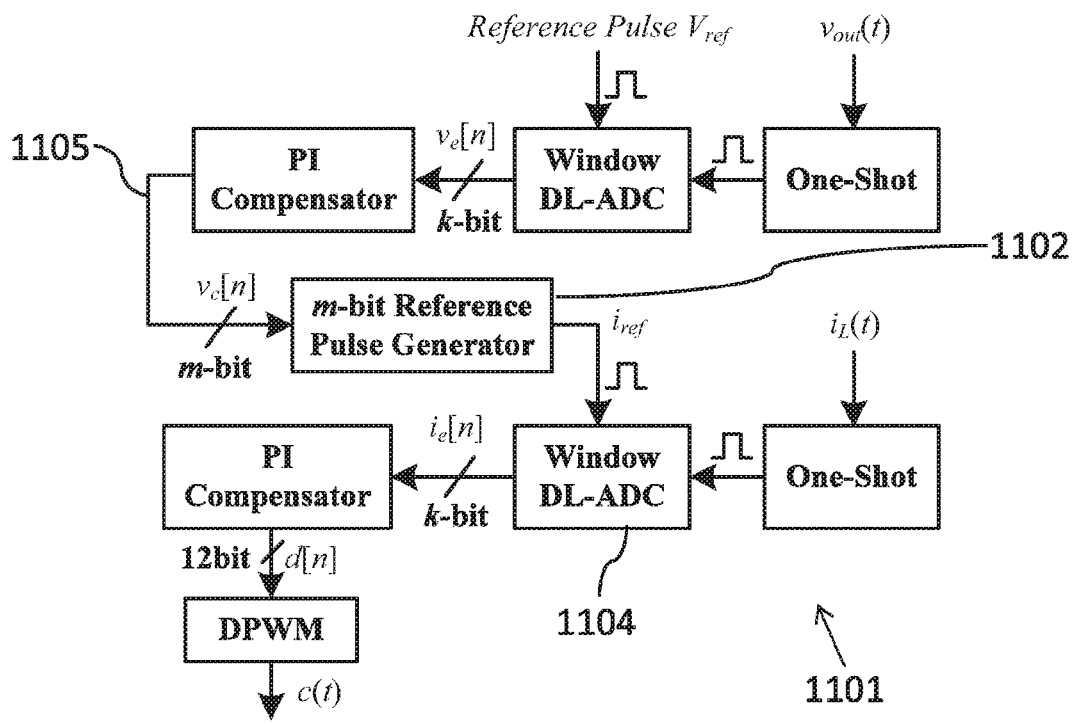
FIG. 11 schematically illustrates a simplified block diagram of the voltage and current compensation loops of a window DL-ADC according to another embodiment of the present invention.

FIG. 11 schematically illustrates a simplified block diagram 1101 of the voltage and current compensation loops of a window DL-ADC according to another embodiment of the present invention, wherein $v_c[n]$ 1105 is used as the reference value for the inductor current as described. Since the window DL-ADC 1104 employs time representation for its conversion, a reference pulse generator 1102 is provided to convert $v_c[n]$ 1105 into an adaptive reference pulse. This approach provides an adaptive current reference that is generated based on the information of the required current reference, given by $v_c[n]$. By doing so, the window DL-ADC 1104 is used for the full load range of the converter. The resolution of reference pulse generator 1102 determines the resolution of the inductor current sampling. This implies that the effective current resolution is given by Eq. 13, where $I_{L,max}$ and $I_{L,min}$ are the maximum and minimum values of the inductor current, and m is the number of bits of the reference pulse generator.

$$\frac{I_{L,max} - I_{L,min}}{2^m} \left[ \frac{A}{\text{Bit}} \right] \quad \text{Eq. 13}$$

Figure 12:
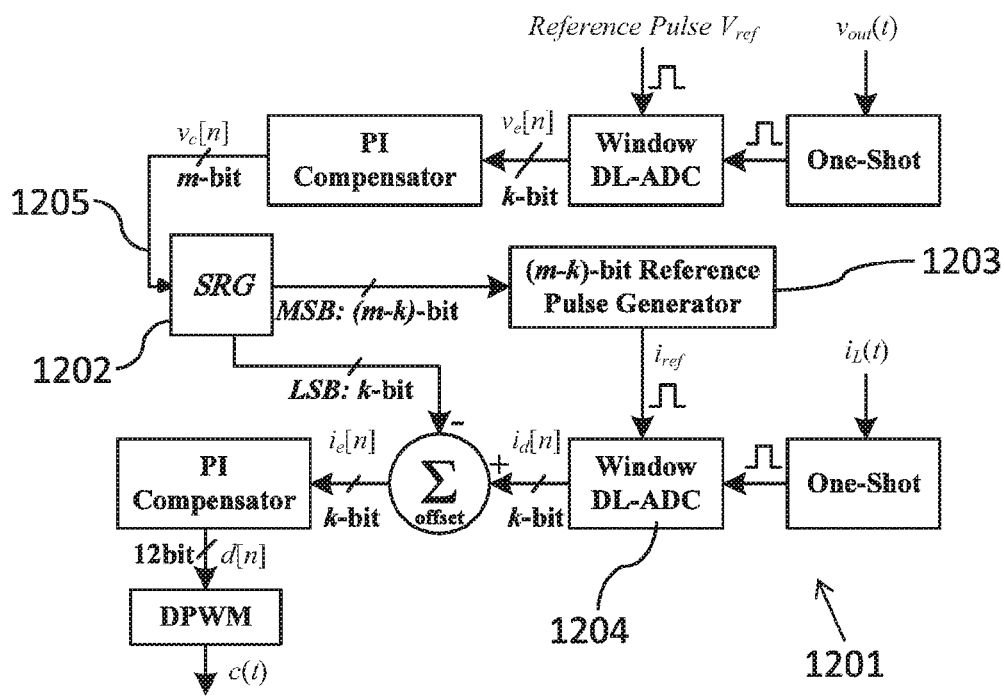
FIG. 12 schematically illustrates a simplified block diagram of the voltage and current compensation loops of a window DL-ADC according to yet another embodiment of the present invention.

In order to obtain high resolution of the inductor current and avoid undesired oscillations, the value of m should be set sufficiently higher than variation per-bit of the voltage loop. This translates into relatively high hardware resources for the implementation of reference pulse generator 1102. FIG. 12 schematically illustrates a simplified block diagram 1201 of the voltage and current compensation loops of a window DL-ADC according to yet another embodiment of the present invention, comprising a low-resource segmented-reference generator (SRG) 1202, provided in order to overcome this obstacle and simplify the design for the reference pulse generator. SRG 1202 splits the value of $v_c[n]$ 1205 to MSB and LSB representation. The MSBs are used as the input for a low resolution reference pulse generator 1203 for the window DL-ADC 1204 to facilitate a coarse-tuned current reference, while the LSBs are used as an offset that is subtracted (by 1205) from the output value of window DL-ADC 1204 for fine-tuning. By doing so, the value of $v_c[n]$ can be tuned to exactly match the current sample.

For sake of simplified demonstration of the operation, steady-state is assumed, i.e. both the current and voltage errors are zero, and the value of $v_c[n]$ corresponds to the actual inductor current. Due to the low resolution of the reference pulse, the output $i_d[n]$ of window DL-ADC 1204 is non-zero. To compensate for this non-zero value of $i_d[n]$, the LSBs of $v_c[n]$ are subtracted from it, and the current error $i_e[n]$ is zero. Segmentation of the MSBs and LSBs depends on the value of m and the number of bits of window DL-ADC 1204, defined by k. The minimal number of MSB bits is m–k, guaranteeing that the value obtained by window DL-ADC 1204 will not saturate due its limited dynamic range of k bits. The selection of a minimum number of MSB bits results in the leanest and most efficient hardware requirements due to the fact that the pulse generator resolution is the lowest.

Figure 13:
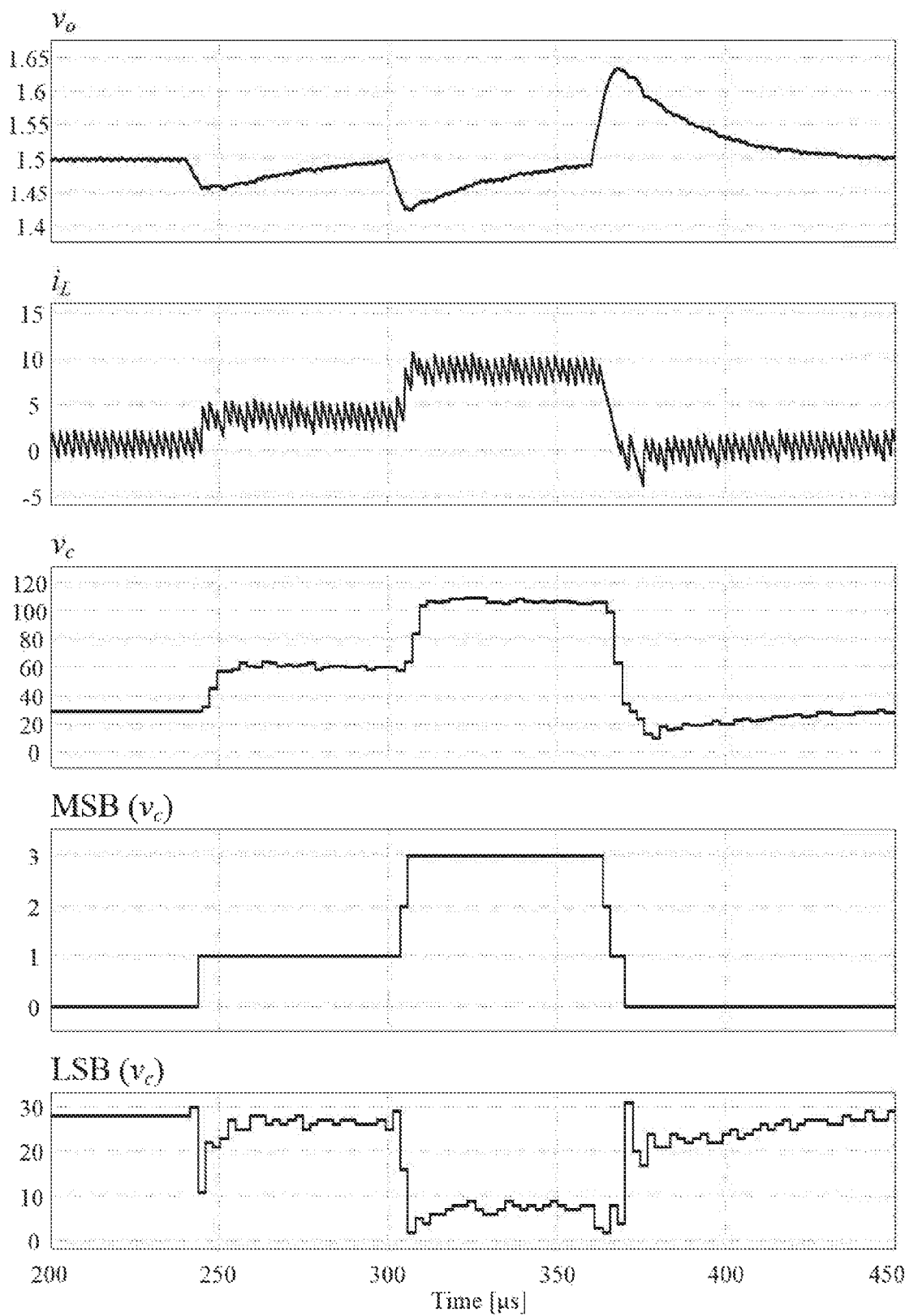
FIG. 13 shows simulation results verifying the operation of the window DL-ADC of FIG. 12.

To verify the operation of the adaptive current reference with the SRG 1202 and window-DL-ADC 1204 for the full load range, a PSIM simulation has been conducted. FIG. 13 shows the simulation results, where it can be observed that under various load transients the inductor current $i_L$ exactly follows the value of $v_c[n]$ for the full load range with the window DL-ADC 1204 used to sample the inductor current. Also shown are the values of the 2 MSBs and 5 LSBs in decimal basis, i.e. for this case m=7 and k=5. The MSBs are used to change the reference pulse as a coarse reference tuning and the LSBs are subtracted from the window DL-ADC result in order to maintain fine tuning of the reference. During steady-state, there is no change in the MSBs and the current reference is finely tuned exclusively by the LSBs. In the event of a load transient, a larger change in the current reference value is required, i.e. in $v_c[n]$, and therefore the MSBs vary while the LSBs maintain the fine control of this reference to preserve it with high resolution.

Mixed-Signal IC Implementation

The mixed-signal IC of the VRM shown in FIG. 4 integrates power, analog and digital circuits on one die. To satisfy proper operation, several layout constraints such as adding guard rings and isolation wells between devices may been employed to reduce coupling noise and undesired holes/electrons injections. This section primarily focuses on embodiments of IC implementation, design considerations of the power-stage and the digital blocks' implementation procedure.

According to an embodiment of the invention, the mixed-signal IC's synchronous buck power-stage is constructed by N-channel devices for both the high and low side switches. In this embodiment, these are realized by a 5V-gated LDMOS power device. The use of LDMOS allows higher voltage swing operation of a monolithic DC-DC converter, since its typical breakdown voltage is higher than the standard 5V CMOS device. Each switch has a dedicated driving stage designed with a 5V CMOS, whereas $Q_{HS}$ transistor requires a bootstrap driver and floating level shifter configuration to overcome the limitations of a standard CMOS device breakdown voltage. The architecture and considerations of the high-side (HS) level shifter is discussed in the next subsection. The driving stages are realized by four dedicated custom designed buffers with high sinking-sourcing capabilities.

The switches are designed symmetrically with an on-resistance of 35 mΩ. The effective gate width $W_g$ of the switches is 200,000 μm. Each switch is constructed from 4000 fingers, creating a symmetrical quadrilateral layout pattern.

Figure 14:
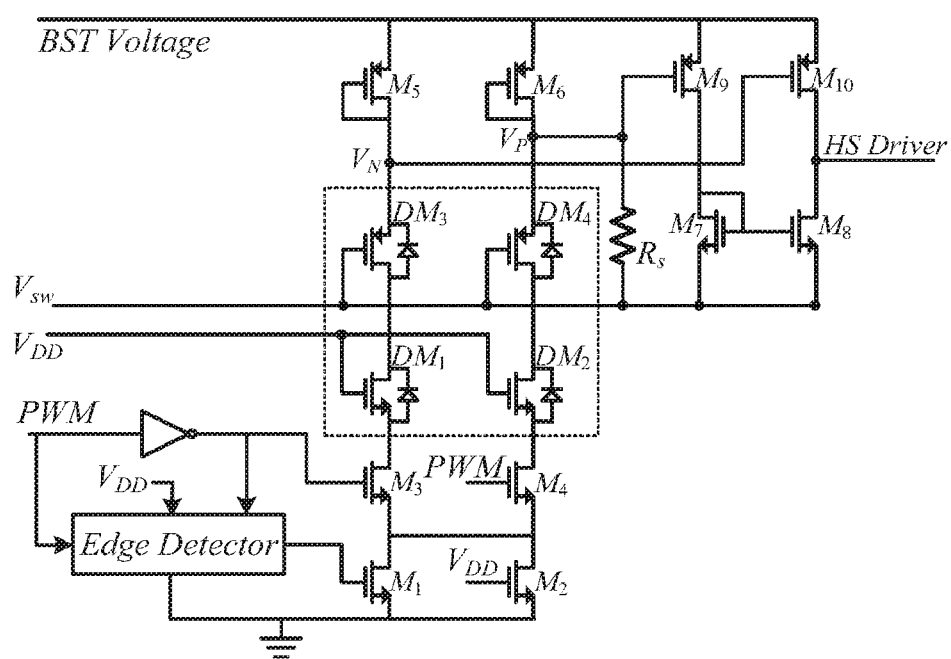
FIG. 14 schematically illustrates a high voltage level shifter circuit according to an embodiment of the present invention.

According to an embodiment of the invention, the HS transistor is driven by a bootstrap configuration to assure proper driving signals of the power-stage. By realizing such approach, the voltage drop on the level shifter is potentially a full rail-to-rail voltage swing from $V_{in}$+5V to ground, damaging the CMOS device. One approach to overcome this issue, is designing the level shifter circuit with LDMOS devices only, which results in a significant larger die-size and higher power consumption. FIG. 14 schematically illustrates a high voltage level shifter circuit 1401 according to an embodiment of the present invention, implementing the aforementioned approach. Circuit 1401 merges both CMOS and LDMOS, such that several LDMOS devices ($DM_1$-$DM_4$) are used only in critical branches for absorbing high voltage drop.

A unique feature of the level shifter develop in this embodiment is that it does not require biasing circuitry for its operation and relies on the logic rail alone. This is accomplished by appropriate sizing of transistors $M_1$ and $M_2$ with respect to $V_{DD}$, creating a self-biased level shifter circuit. The level shifter circuit is divided into three main sub-units: an edge detector that triggers the level-shifter whenever the PWM signal changes, a shifting unit comprising $DM_1$-$DM_4$ to absorb the high voltage drop to assure that the stress on $M_1$-$M_4$ does not exceed 5V, and finally a differential pair that saturates the differential change between $V_P$ and $V_N$, such that the PWM signal voltage levels, $V_{DD}$ and ground, are shifted to $V_{sw}$ and $V_{sw}$+5V, respectively. The output signal of the differential pair controls the floating drive circuitry of the HS transistor.

Resistor $R_s$ is added between $V_{sw}$ and the positive branch $V_{plus}$ of the shifting unit branches in order to intentionally cause a slight voltage difference between the branches. By doing so, the gate of the HS transistor is normally pulled-down, thereby eliminating false-enable or shoot-through current scenario that may be a result of an undesired noise. It should be noted that the value of $R_s$ also determines the offset voltage between the branches.

The matching of the differential pair's transistors $M_9$ and $M_{10}$ primarily depends on the process variations. This may be addressed in the layout stage by using common-centroid technique for $M_9$ and $M_{10}$, where $M_7$ and $M_8$ are also highly matched to achieve accurate active load operation. Additionally, isolating guard rings to improve the noise-immunity of the diff-pair may be added.

According to an embodiment of the present invention, the realization of the digital controller relies on a digital implementation flow, using vendor's standard cells only. In this embodiment, the digital implementation is carried out through two main steps. In the first step, the controller's units are described in HDL as standalone units for the simplicity of the verification and behavioral functionality simulations. Then, each unit is synthesized using synthesis and timing verification tools into an optimized gate-level representation, given a set of design constraints (such as skew, jitter, power consumption, etc.). The layout of each unit can then be generated by an automated place-and-route process. In the second step, all the units are integrated together onto the higher hierarchy of the digital controller.

Finally, the digital controller may be integrated with the power and analog units, creating the finalized digital ACM buck converter IC. The main characteristics of the digital controller include the digital core active area and current draw are summarized in Table 1.

TABLE 1

| IC Block/Digital Core | 0.18 µm CMOS |
|---|---|
| Supply voltage | 5 V |
| $t_{pd, DE}$ buffer | 200 ps |
| DPWM resolution | 12-bits |
| DPWM nominal frequency | 1.25 MHz |
| DPWM Si area | 0.03 mm² |
| ADC resolution | 6-bit |
| ADC conversion time | 20 ns |
| ADC Si area | 0.022 mm² |
| PI calculation time | <40 ns |
| PI Si area | 0.034 mm² |
| Digital core current-draw | 58 µA/MHz |
| Effective digital core Si area including Ring-Oscillator, Dead-Time and SPI | 0.16 mm² |

It should be further emphasized that the controller's design may scale with the technology, such that its overall area and power consumption can be significantly reduced by implementing it to a deeper sub-micron process.

To achieve good PWM regulation with digital control, and to avoid limit-cycle oscillations, it is required that the resolution of the DPWM is sufficiently high with respect to resolution of the ADC. This translates into a limitation on the maximum switching frequency that can be obtained by the digital controller, which then affects the overall size of the controller and the performance in closed-loop. For a given $t_{pd,DE}$ of a single delay element that equals 200 ps and a desired DPWM resolution is 12-bit, using Eq. 12, the obtained switching frequency $f_s$ is 1.25 MHz. From Eq. 12 it can be seen that $f_s$ is inversely proportional to DPWM resolution, such that decreasing the resolution by a single bit will increase $f_s$ by a factor of two. For the case of the lower operating frequency (620 kHz), the time base of 200 µs is preserved and implies that for 620 kHz the DPWM resolution is increased by a single bit.

Closed-Loop Experimental Verification

A fully-integrated digital ACM control VRM IC has been designed and fabricated in 0.18 µm 5V CMOS process. To demonstrate the operation of the digital controller and to validate closed-loop operation, the mixed-signal IC has been verified with experimental results, whereas the IC connects to an external filter of L=2.2 µH, $C_{out}$=50 µF. The VRM IC has been tested under two operating frequencies of 1.25 MHz and 620 kHz, with the ability to deliver up to 12 W from a 12V input. Experimental kelvin resistance measurements of the packaged IC converter report approximately 120 mΩ and 200 mΩ for the LS and HS switches, respectively. The deviation between the target on-resistances (~35 mΩ) and the measured on-resistances can be explained by bond wires and package limitations.

Table 2 summarizes the mixed-signal VRM IC main characteristics.

TABLE 2

SUMMARY OF THE MIXED-SIGNAL IC CHARACTERISTICS

| Specifications | Value/Type |
|---|---|
| Package | 5x5 QFN - MLP |
| $V_{in}$ | 12 V |

TABLE 2-continued

SUMMARY OF THE MIXED-SIGNAL IC CHARACTERISTICS

| Specifications | Value/Type |
|---|---|
| Power-stage $R_{on}$ LS/HS | ~120 mΩ, ~200 mΩ |
| $V_{out}$ | 1.5 V |
| Off Chip L, $C_{out}$ | 2.2 µH, 50 µF |
| Switching frequencies $f_s$ | 1.25 MHz, 620 kHz |
| Total chip Si Area | 4.4 mm² |

Figure 16:
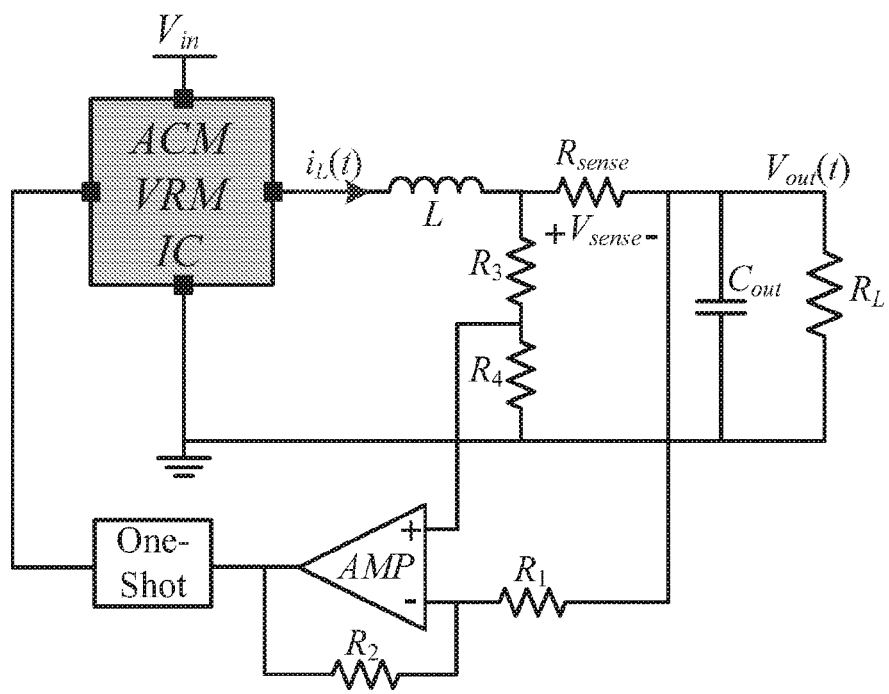
FIG. 16 shows a diagram of a current sensing circuit, according to an embodiment of the invention.

The current sensing for the inner current loop is obtained by an off-chip series-sense resistor setup. A precise power metal strip sense-resistor, $R_{sense}$, has been inserted in series with the inductor as shown in FIG. 16. Series-sense resistor is an accurate, simple, cost-effective sensing technique with a stable temperature behavior. However, since the resistor is placed in the power path of the DC-DC converter, potentially, a considerable amount of power can be dissipated through the resistor. Therefore, $R_{sense}$=10 mΩ has been chosen. The inductor current $I_L$ is sensed by measuring the voltage difference $V_{sense}$ across $R_{sense}$:

$$v_{sense} = I_L R_{sense},$$

where the sensed signal, $V_{sense}$, is amplified by the difference amplifier configuration to voltage levels suitable for the one-shot timer and controller operation.

Figure 17B:
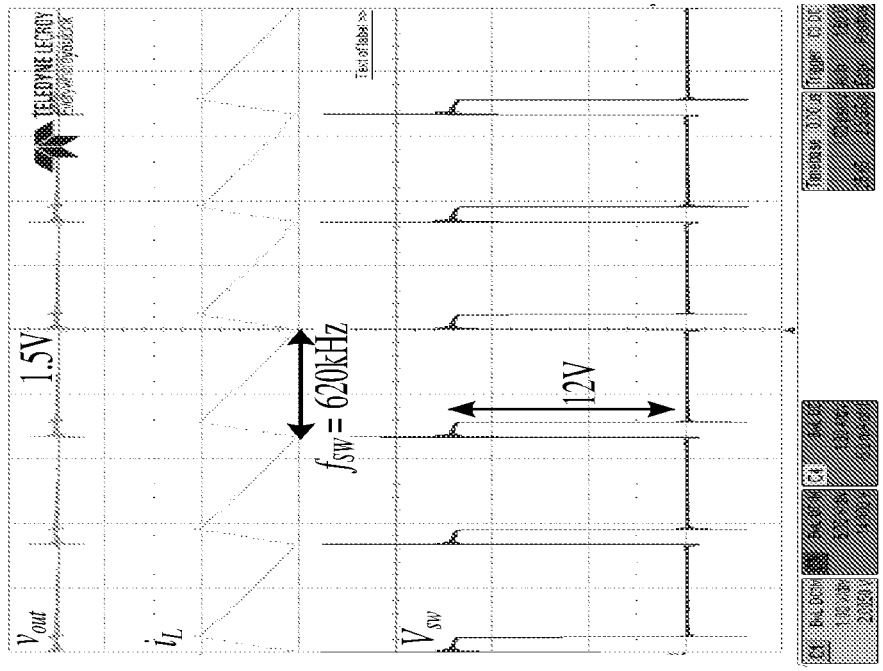
FIG. 17 shows experimental steady-state waveforms of the closed-loop system, for 12V input at 1.25 MHz and 620 kHz operation and duty-ratio of 0.125.
Figure 17A:
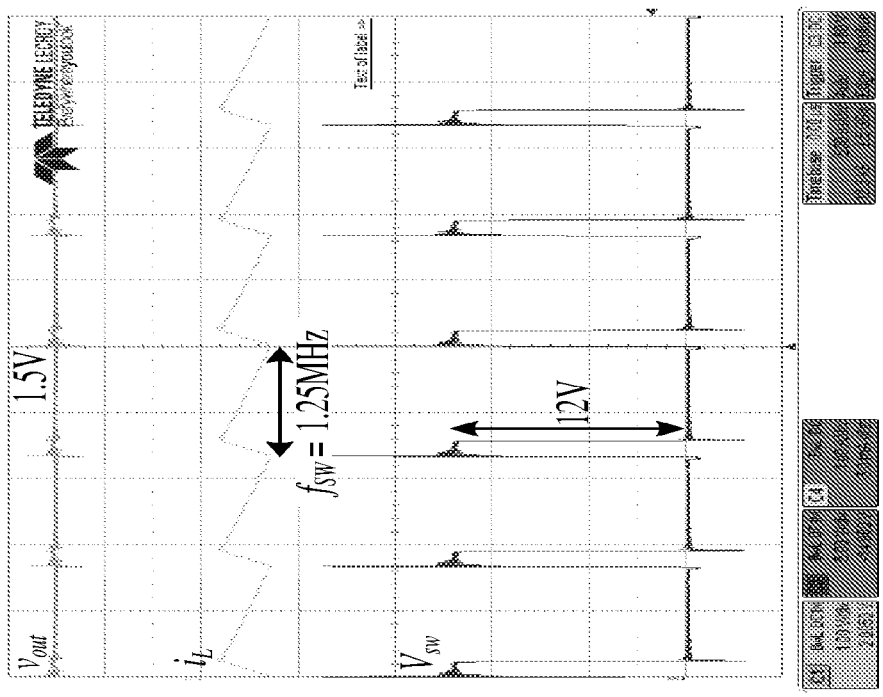

FIG. 17 shows experimental steady-state waveforms of the closed-loop system, for 12V input at 1.25 MHz and 620 kHz operation and duty-ratio of 0.125. For both operating frequencies, smooth low-to-high and high-to-low transitions operation can be observed, validating the proper operation of the high-side level shifter.

Figure 18B:
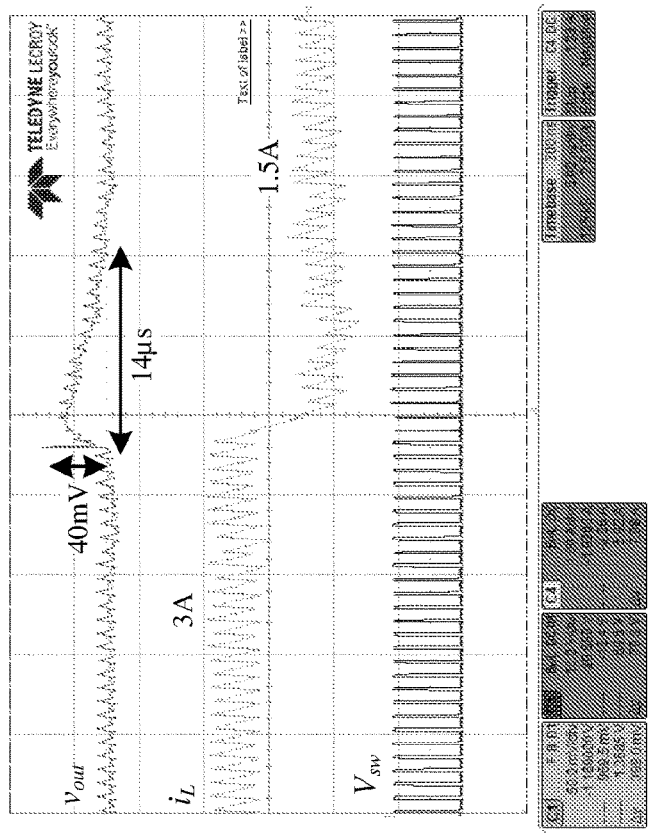
FIG. 18 shows load transient events of 1.5 A and $V_{out}$=1.5V with operating frequency of $f_s$=1.25 MHz.

Experimental load transient responses of the VRM IC with a constant current reference value (non-adaptive current compensation loop) are shown in FIGS. 18 and 19. A load transient events of 1.5 A and $V_{out}$=1.5V with operating frequency of $f_s$=1.25 MHz is depicted in FIG. 18. An output voltage undershoot of 40 mV has been measured with settling time of 15 µs. FIG. 18b shows the response of the converter to 1.5 A unloading transient, from 3 A to 1.5 A. As can be observed, the output voltage overshoot is 40 mV and 14 µs is the time it takes for the system to set back to the steady-state. For operating frequency of $f_s$=620 KHz (FIG. 19), the loading transient event resulted in 50 mV undershoot and settling time of 201 µs, whereas for the unloading event the output voltage overshoot has been measured to be 70 mV and 25 µs for the settling time. Although rapid dynamics were not a primary objective of the present invention, it can be observed that for both operating frequencies at the load transient events, the output voltage is well regulated with reasonable and comparable performance. It should be noted that due to the use of a constant current reference and the limited dynamic range of the window DL-ADC the load transients' magnitudes were limited to 1.5 A. It can also be seen that the recovery from a loading transient is facilitated with moderate duty ratio increase, which may appear as limitation of the duty ratio generation. The recovery pattern is a result of moderate bandwidth and gain settings of the controller that have been prescribed to satisfy a first-order type recovery when operating at lower switching frequency, and does not stem from limitations of the hardware. This assertion is backed up the results of FIG. 18 which show better higher boosting of the duty ratio, for the same load transient, as a result of higher allowed controller gain when operating at higher switching frequency.

Figure 18A:
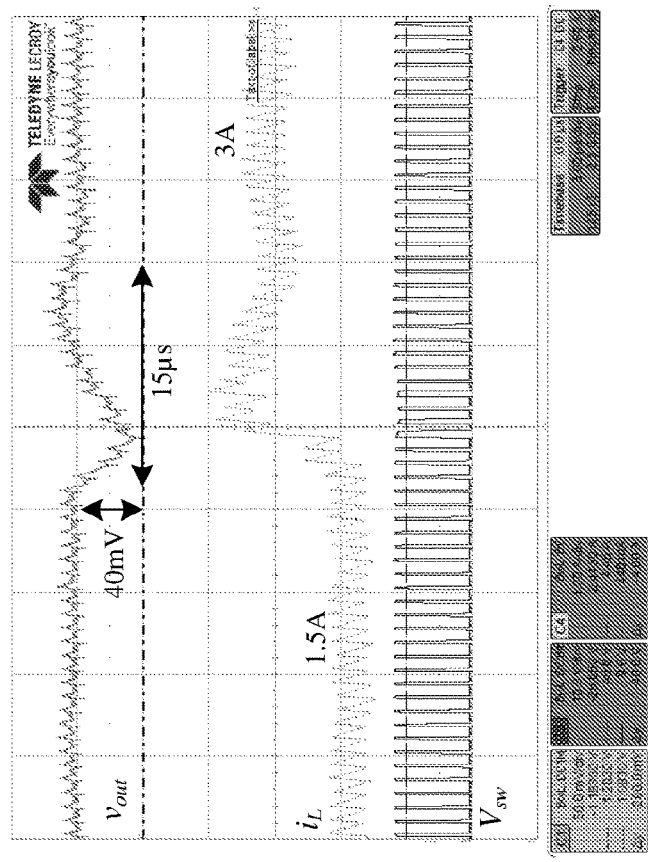

FIGS. 18a and 18b shows experimental results of 1.5 A loading and unloading, respectively, for transient events operating at 1.5 MHz.

Figure 19B:
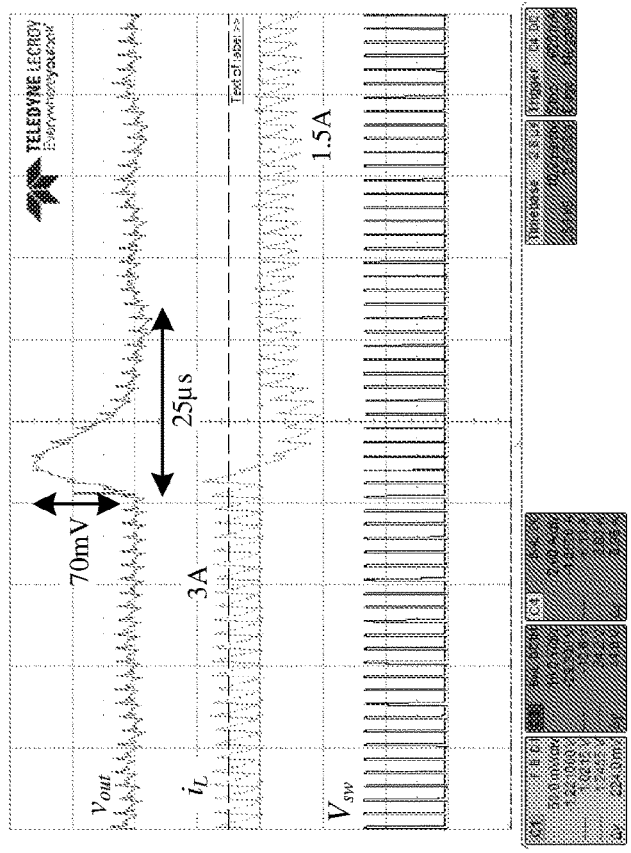
FIG. 19 shows experimental results of 1.5 A loading (a) and unloading (b) transient events operating at 620 kHz.
Figure 19A:
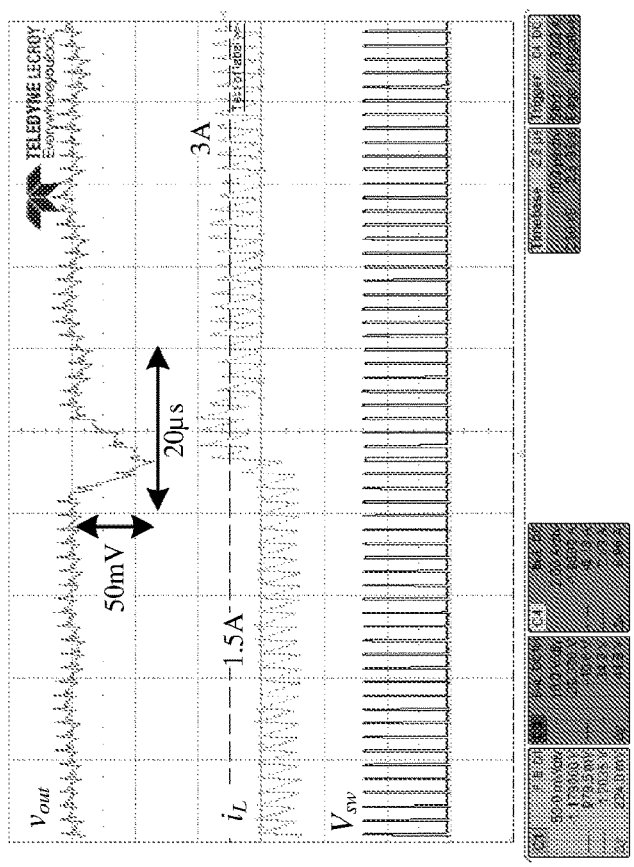

FIGS. 19a and 19b shows experimental results of 1.5 A loading and unloading, respectively, for transient events operating at 620 kHz.

To further validate the new digital ACM controller approach and demonstrate the operation for a wider range of load changes, the experimental setup has been reassembled with L=1.51 µH and $C_{out}$=300 µF.

Figure 20B:
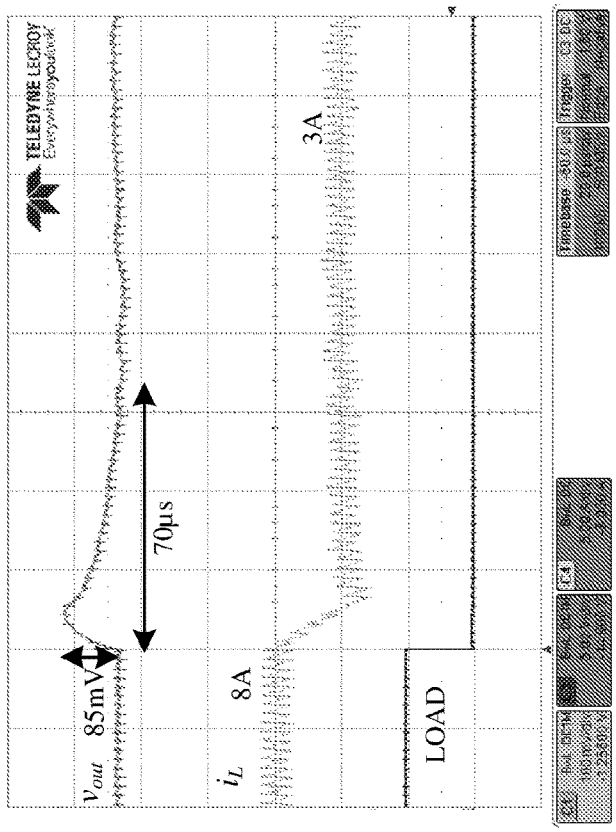
FIGS. 20a and 20b shows experimental results of 5 A loading and unloading, respectively, for load transients of 5 A, at 12V-to-1.5V regulation.
Figure 20A:
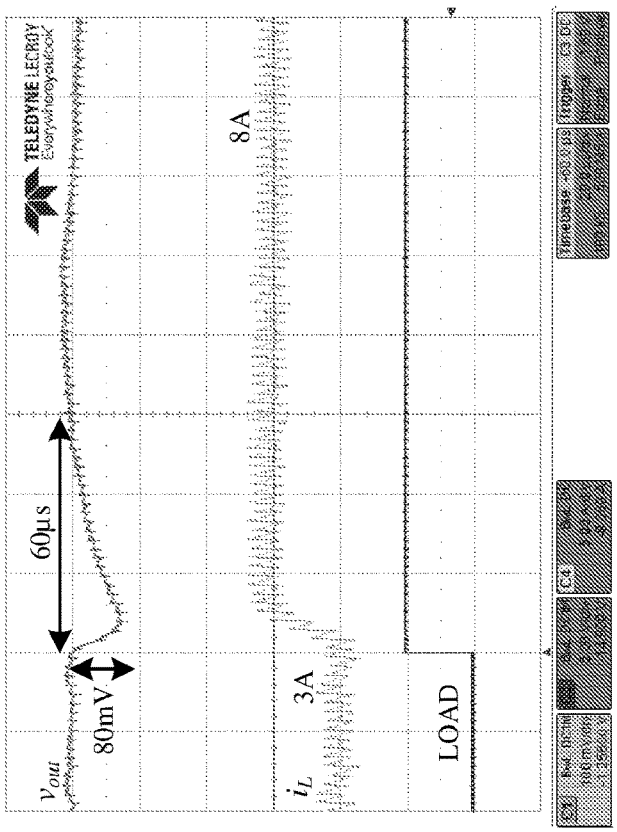

FIGS. 20a and 20b shows experimental results of 5 A loading and unloading, respectively, for load transients of 5 A, at 12V-to-1.5V regulation. It can be observed that for 5 A loading transient (FIG. 20a) the output returns to regulation within 601 µs and overall output voltage undershoot of 80 mV. For 8 A to 3 A unloading transient event (FIG. 20b) the output voltage overshoot sums to be 85 mV, while the system settles down back to the steady-state conditions within 70 µs. As can be observed, well-regulated responses are obtained with reasonable and comparable dynamics.

Figure 21:
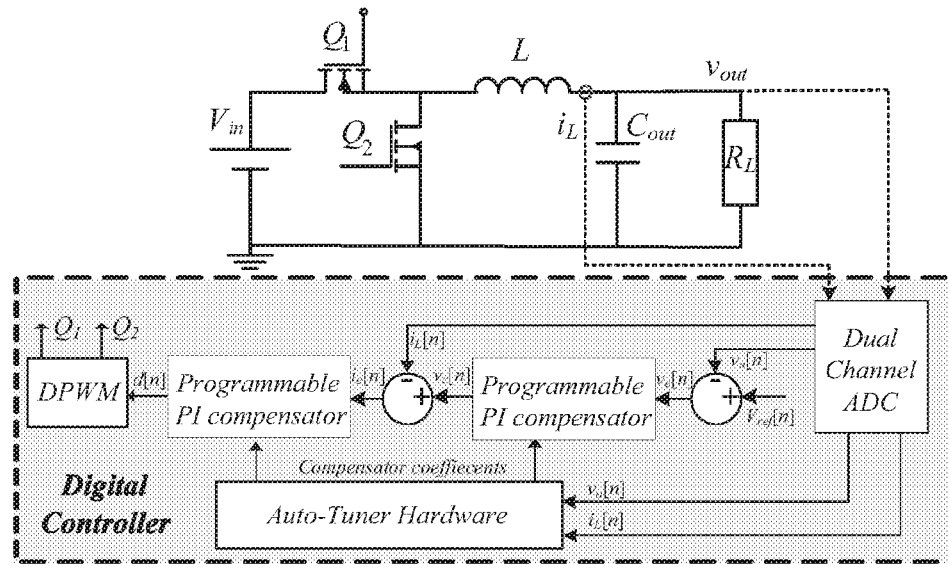
FIG. 21 shows a simplified diagram of a synchronous buck converter with the digital auto-tuning ACM controller.

The present invention also proposes a new hardware efficient auto-tuning process, specifically developed for integrated digital average-current mode digital PWM (DPWM) control. The design of a fully digital auto-tuning ACM controller follows the conventional two-loop ACM design with an all-digital outer voltage and inner current loops, as shown in FIG. 21. The proposed auto-tuning process is applicable upon system power-up, i.e. through the soft-start routine. The process relies on the data acquired by the digital controller of the SMPS (with additional dedicated hardware) to identify the system parameters and derives the compensation coefficients of both loops to meet a desired closed-loop response based on the specified system phase margin and bandwidth.

Auto-Tuning Procedure for ACM Controllers

Many conventional current-programmed controllers prefer the Peak Current-Mode (PCM) control method over ACM, due to the fact that PCM can achieve superior dynamics and offer cycle-by-cycle protection with simpler hardware. With digital implementation, the hardware requirements of ACM controllers are equivalent, or even lower than those of voltage-mode control. Since no high-speed mixed-signal design is required (as in the case of PCM, as it can be designed entirely by HDL description), ACM control becomes an attractive compensation type. Adding the flexibility in the compensator design and straightforward approach for current sharing, several commercial applications have been recently implemented digital ACM for voltage regulators, particularly for higher power, where dual and multiphase converters are required.

Figure 22:
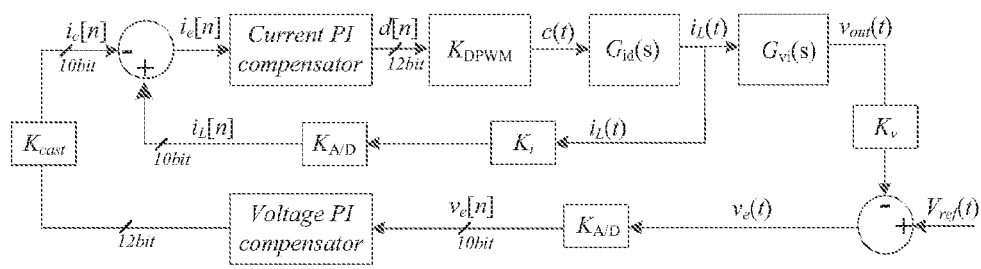
FIG. 22 is a block diagram including the buck converter and ACM controller corresponding gains.

FIG. 22, shows a conceptual block diagram of the control system of the digital ACM controller. As can be seen in FIG. 22, the controller follows the conventional two-loop ACM design with an all-digital outer voltage and inner current loops. The voltage loop creates a digital reference $i_c[n]$ for the average current value $i_L[n]$, based on the voltage error signal $v_e[n]$ and the voltage loop compensator. The generated current error signal $i_e[n]$ is the input to a current loop compensator that generates the duty-command d[n] which is then sent to the DPWM, and a pulse width modulated signal c(t) is created.

Based on the ACM controller architecture, in the context of auto-tuning of the controller, two sets of compensators' coefficients need to be extracted for the inner (current) loop and outer (voltage) loop compensator. The design of two loops with significantly different bandwidths (i.e. the current loop is with a wider bandwidth than the voltage loop), simplifies the compensators' structure, and a simple PI scheme can be used for both current and voltage loops' compensators. Since each loop is tightly regulated using a single state-variable, decoupling of the loops can be assumed (i.e. the coefficients for each controller can be extracted independently and further adjusted without significantly affecting the operation of the other loop).

It is assumed that the input voltage $V_{in}$ and the nominal load current $I_{out}$ of the power stage are known or can be measured. All the other converter's parameters, with special emphasis on the converter's inductance L and capacitance $C_{out}$, are unknown and may vary, either as a result of design considerations or as a result of a drift. It is further assumed and justified by the control scheme that the compensators' template is PI-type. Two state-variables measurements in system are used for the output voltage $v_{out}$ and the inductor current $i_L$, and they are obtained using dual-channel Analog-to-Digital Converter (ADCs). The coefficients are extracted by the information available in the loop, either as a result of natural variation (current ripple) or induced perturbation of the state-variables (will be detailed below). The aim of the auto-tuning algorithm is to extract the compensators' parameters to achieve tight output voltage regulation as well as stability over wide range of L and $C_{out}$ values.

More precisely, the performance goals are specified to satisfy: a) a minimal phase margin of 45° for both loops; b) control bandwidth as high as possible, derived as a fraction the switching frequency under the assumption that the current loop has higher bandwidth as the voltage loop; c) the output voltage is kept within specified margins.

To assure that stability is achieved within all corners of the variations that have defined the operation range, "artificial" tolerances are added to the design procedure. That is, although a single set of coefficients can achieve the target goal per specified plant, stability verification is embedded into the algorithm to cover the full range that is specified. This implies that the dynamic response is optimized to one set of values and would deviate from that point for other values, but as long as the values are within the tolerance range that has been assumed, stability is maintained. The auto-tuning procedure is applicable at running mode, but also during start-up, i.e. when $v_{out}$ has not yet reached its nominal value. This means that with the tuning procedure, the controller must also observe and correct $v_{out}$. To this end, a voltage-mode integrator-type compensator of low bandwidth (significantly lower than the target) is initially set on power up and is in charge of ramping up the output voltage, i.e. by slowly increasing the reference $V_{ref}$.

A high-level view of the tuning procedure is illustrated in FIG. 15, which can be divided into two main stages. When the tuning procedure initiated, a default set of pre-loaded coefficients are used to both compensators. These can be obtained from the initial specification of the target application. In case where no information is available on the system, the values are set to satisfy stability with very low bandwidth that is derived as a fraction of the switching frequency. The tuning operation is conducted per loop. First, the algorithm extracts coefficient for the current loop. This is done by the information obtained from the inductor's current ripple on a basis of sampling twice per switching cycle. Effectively, along with the information of the system voltages, the measurement of the inductor current ripple estimates the inductance value, from which the compensator may be set with a defined crossover frequency. Once the inner current loop tightly regulates the average value of the inductor current, the system is of first order and stability is satisfied (but not regulation).

The next stage of the tuning process is to achieve the dynamic performance by extraction of the coefficients of the voltage loop. In this stage, the inner current loop is used as a current source to drive a small current step to the output RC network and perturb its voltage from which an estimate of the output capacitance provides the required information to set the coefficients of the second compensator.

Extraction of the ACM Controller Coefficients

An established virtue of any two-loop compensation for SMPS is order reduction of the system from a second order into two simpler control loops. Under ACM control scheme, a PWM and in particular a buck converter can be well approximated by a first-order system at frequencies well below the switching frequency $f_{sw}$, and therefore a PI-type compensator suffice. A conventional PI compensator transfer function in the continuous-time domain can be expressed as $$G_{comp}(s) = k_P \left(1 + \frac{1}{sT_i}\right), \qquad \text{Eq. 14}$$

where $k_p$ is the compensator's proportional gain and $T_i$ is the integrator time constant which determines the compensator's zero, i.e. $T_i = 1/2\pi f_0$. By applying the pole-zero matching method on Eq. 14, the discrete-time representation of the template for the PI compensator is given by $$G_{comp}(z) = \frac{a - b \cdot z^{-1}}{1 - z^{-1}}, \qquad \text{Eq. 15}$$

where a, b are the compensator coefficients, and can be calculated as $$a = k_p, b = k_p(1 - T_s/T_i), \qquad \text{Eq.16}$$

where $T_s$ is the sampling period.

The compensator coefficients are set so that the closed-loop goals are achieved for both phase margin and control bandwidth. The closed-loop response of a first-order system that is controlled by a PI-type compensator has a well-defined behavior. The controller gain with respect to the open-loop response determines the bandwidth while the location of the PI's zero controls the phase margin. From Eq. 14 Eq. 16, it can be observed that in this case too, the assignments of the coefficients follows a similar method. The control bandwidth of the proportional gain $k_p$ is set as the gain value at the target crossover frequency $f_c$. Next, to satisfy stability with prescribed phase margin $\varphi_m$, the frequency of the compensator's zero $f_0$ is set using the following expression $$f_0 = f_c \sqrt{\frac{1 - \sin(\varphi_m)}{1 + \sin(\varphi_m)}} = \frac{1}{2\pi T_i}. \qquad \text{Eq. 17}$$

The crossover frequency is set as a fraction of the switching frequency, typically one-tenth (1/10) to one-eighth (1/8) for the outer voltage loop and approximately one-fifth (1/5) for the inner current loop. By doing so, the tuning procedure does not depend on preceding information or data of the system to facilitate closed-loop operation. Assuming that the power stage is designed according to the frequency range, the system dynamics are continuously optimized to widest response bandwidth that can be achieved with a steady-state linear-type compensation. In addition, the information of the switching frequency is internally available to the controller, which requires very few resources (or none) to obtain.

Current Compensator Design

Given target closed-loop parameters, the tuning task is to extract the integral time constant $T_{i,I}$ and the proportional gain $k_{pI}$ for the inner current loop. As mentioned earlier, the former is determined by Eq. 17 to satisfy stability. The latter is inversely proportional to the overall gain of the inner current loop, and with the aid of FIG. 22 can be found as $$k_{pI} = \frac{1}{G_{id}(s) K_I K_{A/D} K_{DPWM}}, \qquad \text{Eq. 18}$$

where $K_I$ is the gain due to the current sensing, $K_{A/D}$ and $K_{DPWM}$ are the gains of the peripheral units of the current loop, and $G_{id}(s)$ is the control-to-output transfer function of the inner current loop, in a buck converter is given by $$G_{id}(s) = \frac{i_L(s)}{d(s)} = \frac{V_{in}}{sL + R_{DCR}}, \qquad \text{Eq. 19}$$

where $R_{DCR}$ is the dc resistance of the inductor.

By substituting Eq. 19 into Eq. 18, and setting $s = 2\pi f_{cI}$ at the target crossover frequency of the current loop, Eq. 18 can be rewritten as $$k_{pI} = \frac{2\pi f_{cI} L + R_{DCR}}{V_{in} K_I K_{A/D} K_{DPWM}}. \qquad \text{Eq. 20}$$

It should be noted that, since $R_{DCR}$ is relatively small, it is therefore neglected during the tuning procedure. From Eq. 20, it can be seen that $k_{pI}$ can be extracted from the information of the input voltage $V_{in}$ (which is known or can be measured) and the inductance L (the peripherals gains i.e. $K_I$, $K_A$, $K_{DPWM}$ are known constants). The inductance value can be replaced using the following relationship $\Delta i_L/\Delta t = v_{out}/L$, where $\Delta i_L$ is obtained by two samples of the state-variable within a cycle and $v_{out}$ can be assumed as non-varying or constant for the measurement timeframe (further details are given in Section IV through a design example). Rearranging Eq. 20 and by transformation from a continuous-time to the discrete-time domain, the current loop proportional gain $k_{pI}$ can be expressed as $$k_{pI} = \frac{2\pi f_{cI}}{2 f_{SW} V_{in} K_V K_{A/D} K_{DPWM}} \cdot \frac{v_{out}[n]}{\Delta i_L[n]}. \qquad \text{Eq. 21}$$

As can be seen from Eq. 21, the extraction of the proportional gain kpI primarily depends on the (fixed) ratio between the crossover frequency fcI and the switching frequency fsw, the output voltage and the ripple of the inductor current.

Voltage Compensator Design

In the second stage of the tuning procedure, the proportional gain $k_{pV}$ for the voltage PI compensator is iteratively tuned such that the specified outer loop-gain bandwidth is satisfied. In a similar manner to the current compensator, with the aid of FIG. 22 $K_{pV}$ is inversely proportional to the overall gain of the outer voltage loop and is given as follows $$k_{pV} = \frac{1}{G_{vi}(s)K_V K_{A/D} K_{cast} \frac{1}{K_l K_{A/D}}}, \qquad \text{Eq. 22}$$

where $K_V$ is the gain due to the voltage divider on the output voltage, $K_{A/D}$ and $K_{DPWM}$ are the gains of the peripheral units within the voltage loop, and $K_{cost}$ is the gain due to the matching between the bits number of the voltage compensator and the accumulator (See FIG. 22). $G_{vi}(s)$ is the control-to-output transfer function of the outer voltage loop, in a buck converter it is given by $$G_{vi}(s) = \frac{v_{out}(s)}{v_c(s)} = R_L \frac{sC_{out}R_{ESR} + 1}{sC_{out}R_L + 1}, \qquad \text{Eq. 23}$$

where $R_L$ is the load resistance and $R_{ESR}$ is the equivalent series resistance of the output capacitor $C_{out}$. It should be noted that, while $R_{ESR}$ has an important role in the case of electrolytic capacitors, it is neglected in the case of ceramic capacitors. The transfer function $G_{vi}(s)$ can be expressed as $$G_{vi}(s) = \frac{v_{out}(s)}{v_c(s)} = \frac{R_L}{sC_{out}R_L + 1}. \qquad \text{Eq. 24}$$

By substituting Eq. 24 into Eq. 22 and setting $s=2\pi f_{cV}$ at the target crossover frequency of the outer voltage loop, the proportional gain $k_{pV}$ is given by $$k_{pV} = \frac{2\pi f_{cV} C_{out}}{K_V K_{A/D} K_{cast} \frac{1}{K_l K_{A/D}}}. \qquad \text{Eq. 25}$$

From Eq. 25, it can be observed that $k_{pV}$ depends on the peripherals gains, the crossover frequency and output capacitor value. A major goal of the invention is to avoid the direct extraction of the passive elements. In a similar way as in the extraction of the coefficients in the inner loop, the value of $C_{out}$ is replaced by the following relationship $\Delta v_{out}/\Delta_t = \Delta i_L^*/C_{out}$, where $\Delta i_L^*$ is the (known) perturbation that is applied by the inner current loop as a current source and $\Delta v_{out}$ is obtained by measuring the output state variable. As shown in the tuning flowchart (see FIG. 15), stage II is initiated once the internal current loop is controlled, hence the current compensator is utilized as a current source to perturb the output network (i.e. load steps $\Delta i_L^*$) and then measuring the changes at the output voltage ($\Delta v_{out}^*$). Therefore, by rearranging Eq. 25 and transforming from the continuous-time to the discrete-time domain, $k_{pV}$ can be expressed as $$k_{pV} = \frac{2\pi f_{cV}}{f_{sw} K_{cast}} \cdot \frac{\Delta i_L[n]}{\Delta v_{out}[n]}. \qquad \text{Eq. 26}$$

As can be seen from Eq. 26, the extraction of the proportional gain $k_{pV}$ primarily depends on the ratio between the crossover frequency and the switching frequency and the measurements of the changes in the output voltage as a result of injecting current perturbations.

Design Example

The design procedure for the compensators has been demonstrated using Matlab simulations on a closed-loop system of a synchronous buck converter with the following parameters: $V_{in}=12V$, $V_{out,nominal}=1.2V$, $I_{out,nominal}\approx 4.5$ A, $L=1$ µH, $C_{out}=100$ µF, at a switching frequency of 500 kHz. The target compensators parameters were: for the inner current loop a crossover frequency $f_c$ of 80 kHz with phase margin of approximately 60°; for the outer voltage loop the crossover frequency has been aimed at 40 kHz with phase margin of 75°. Following the above analysis and observations, the discrete-time compensators coefficients have been found to be:

current loop→$a_I$=0.043,$b_I$=0.039 voltage loop→$a_V$=25.13,$b_V$=22.61 Eq. 27

Figures 23A, 23B:
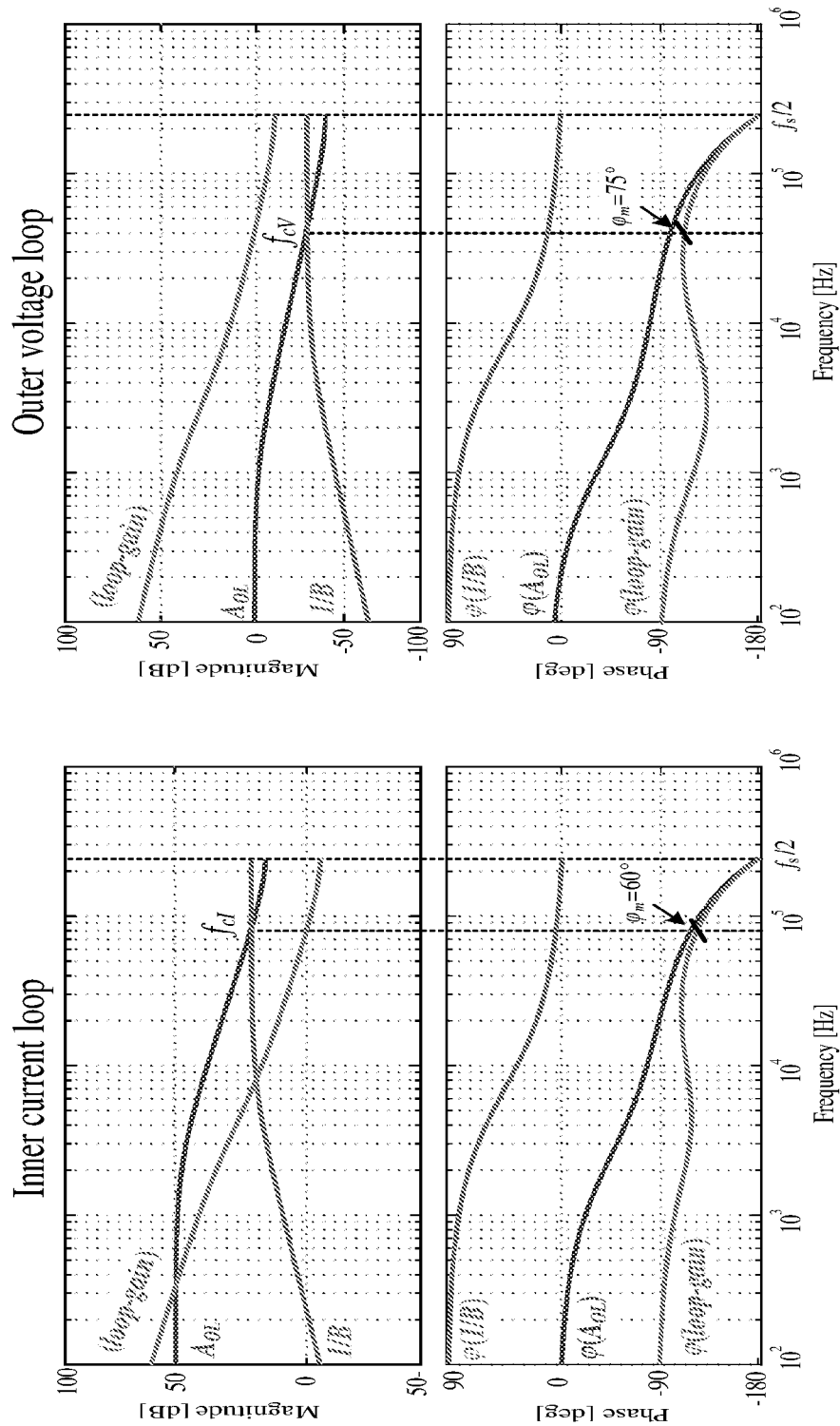
FIG. 23 shows frequency responses of: control-to-output AOL (blue), inverse compensator 1/B (red), and the loop-gain (green). (a) Inner current loop, (b) Outer voltage loop.

The simulation results for the frequency responses of the converter (blue), the 1/B of the compensators (red) and the loop-gains (green) of the inner current and outer voltage loops are depicted in FIG. 23a and FIG. 23b, respectively. It can be observed that the simulation results are in good agreement with the target specifications listed above.

Practical Implementation

To enable closed-loop operation of the system from an initiation of a power-good indication, the auto-tuning process has been embedded into the controller's soft-start routine. In this case, the output voltage is kept below its nominal value throughout the procedure. To view, debug and verify the full auto-tuning process, a cycle-by-cycle simulation test bench has been constructed in PSIM (Electronic circuit simulation software by PowerSim Solutions Inc., Herndon, Va.), where the digital auto-tuning ACM controller has been realized by a C-block. The auto-tuning is demonstrated at an output voltage level of 50% from the nominal output voltage. It should be noted however, that the procedure is applicable at any level of the output voltage and/or load conditions within the expected dynamic range of the system.

Figure 24:
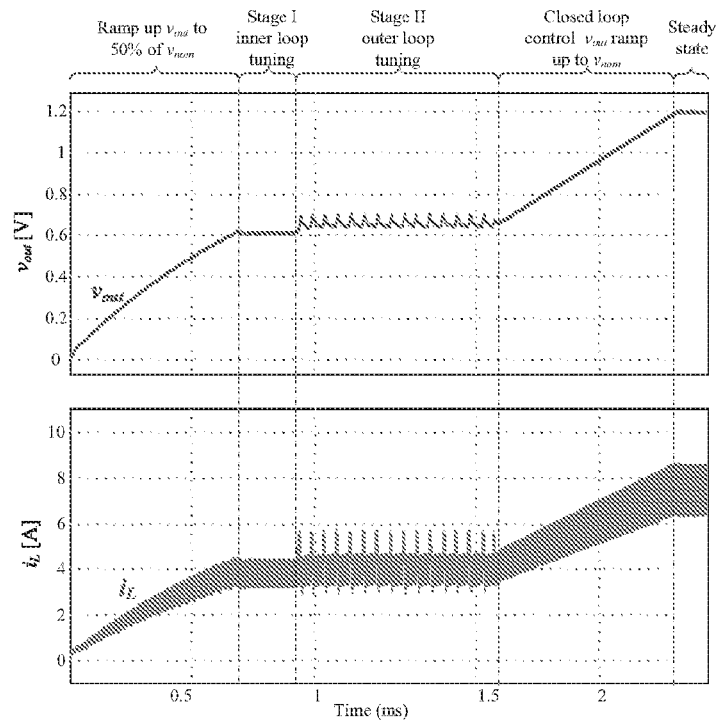
FIG. 24 shows simulation results of the output voltage (top) and inductor current (bottom) ramp up during soft-start with full auto-tuning procedure.

The simulation results for the inductor current and voltage during the start-up and tuning process is depicted in FIG. 24 which details the various phases along the process. It can be seen that the output voltage slowly ramps up to 50%, controlled by a narrow bandwidth voltage-mode compensator, where the tuning operation is initiated. Followed by two tuning stages, both compensators are set and the controller ramps up the output voltage to the nominal value and finalizes the startup phase. The inner (current) loop coefficient extraction is carried out in Stage I. At this stage, the converter operates in a pseudo steady-state operation when the output voltage is in 50% of its nominal value.

Figure 25:
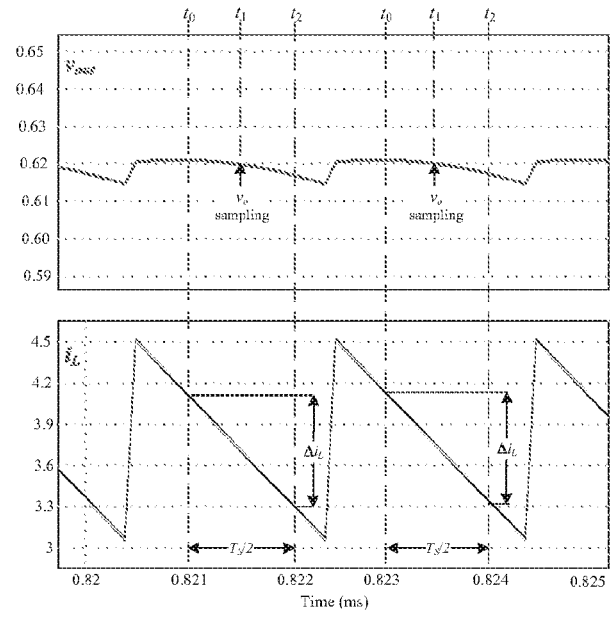
FIG. 25 is a zoomed-in view of FIG. 25 expanding Stage I—extraction of the inner (current) loop compensator. Output voltage vout(t) (top) and inductor current $i_L(t)$ (bottom)

FIG. 25 shows a zoomed-in view of $v_{out}(t)$ and $i_L(t)$ that are measured to obtain $v_{out}[n]$ and $\Delta i_L[n]$. As can be observed, sampling of the output voltage is once per switching cycle at $t_1$, while the inductor current is sampled twice per switching cycle at $t_0$ and $t_2$ to obtain the current slew ($\Delta I_L$). The measurements are then used to calculate the coefficients and current compensator is set active.

In the next step of the tuning process, stage II, the inner loop is used as a source to perturb the output network and obtain the required measurements to derive the voltage loop's compensation. This stage can be viewed in FIG. 26, which zooms into the state-variables during this timeframe. As mentioned earlier, since the inner current loop control operates with higher bandwidth compared to the dynamics of the output network, the injected current inductor current $\Delta i_L^*$ can be considered as a current source from the output side. The realization of the current step is facilitated by instantaneously varying the reference value to the outer loop controller (output product of the inner loop). It can be seen from FIG. 26 that since the perturbation creates a mismatch between the inductor current and the load current, the output voltage rises. The value of $\Delta I_L$ is captured after one switching cycle by the difference between the current samples at $t_0$ and $t_1$. To eliminate potential calculation error due to $R_{ESR}$ of the output capacitor $C_{out}$ or other parasitics, $\Delta v_{out}$ is acquired after two switching cycles by the difference between the voltage samples at $t_1$ and $t_2$. To avoid a constant deviation in the output voltage, once the measurements are obtained, the current reference is set back to its initial value of stage II.

The tuned closed-loop controller's dynamics for 6 A loading and unloading transients are depicted in FIG. 27 for a 12V-to-1.2V converter operating at 500 kHz. As can be observed that for both load transients the output voltage is well regulated with reasonable and comparable performance.

In order to implement the auto-tuning on DPWM controlled SMPS, there is need to obtain the values of state-variables at sampling events sufficiently away from the switching action, thereby allowing to sample with relatively high signal-to-noise ratio. Since perturbation is involved in parts of the tuning process (in particular in Stage II), a compromise must be considered between the amount of deviation that is created (or allowed) in the signal and the accuracy (and resolution) of the perturbation (DPWM unit) and the measurement (ADC). Ideally, the size of the injected perturbation should be kept as small as possible, to guarantee small disturbance at the output voltage, i.e., the operating point will not be moved significantly. However, due to practical limitation of the ADC, the size of the step disturbance designed such that a sufficient change at the output voltage is excited to allow a reliable measurement.

Another noise sources that are not related to the switching action such as quantization or thermal noises may also affect the accuracy of the coefficients extraction. To remedy this, synchronous averaging of samples has been employed to average out misreading of uncorrelated signals. This has been carried out by 32 word-long Auto-Regressive Moving Average (ARMA) filter for Stage I (current loop), and a 16 samples ARMA filter has been utilized in stage II (voltage loop). Obviously, this averaging process significantly extends the duration of the tuning routine, which may be traded for accuracy in cases where the specification mandate shorter periods. It should be noted that the accuracy of the compensators in the long-run is not necessarily compromised since the coefficients may be refreshed or updated at any time as it is applicable at any level of the operating conditions.

Digital Architecture

Figure 28:
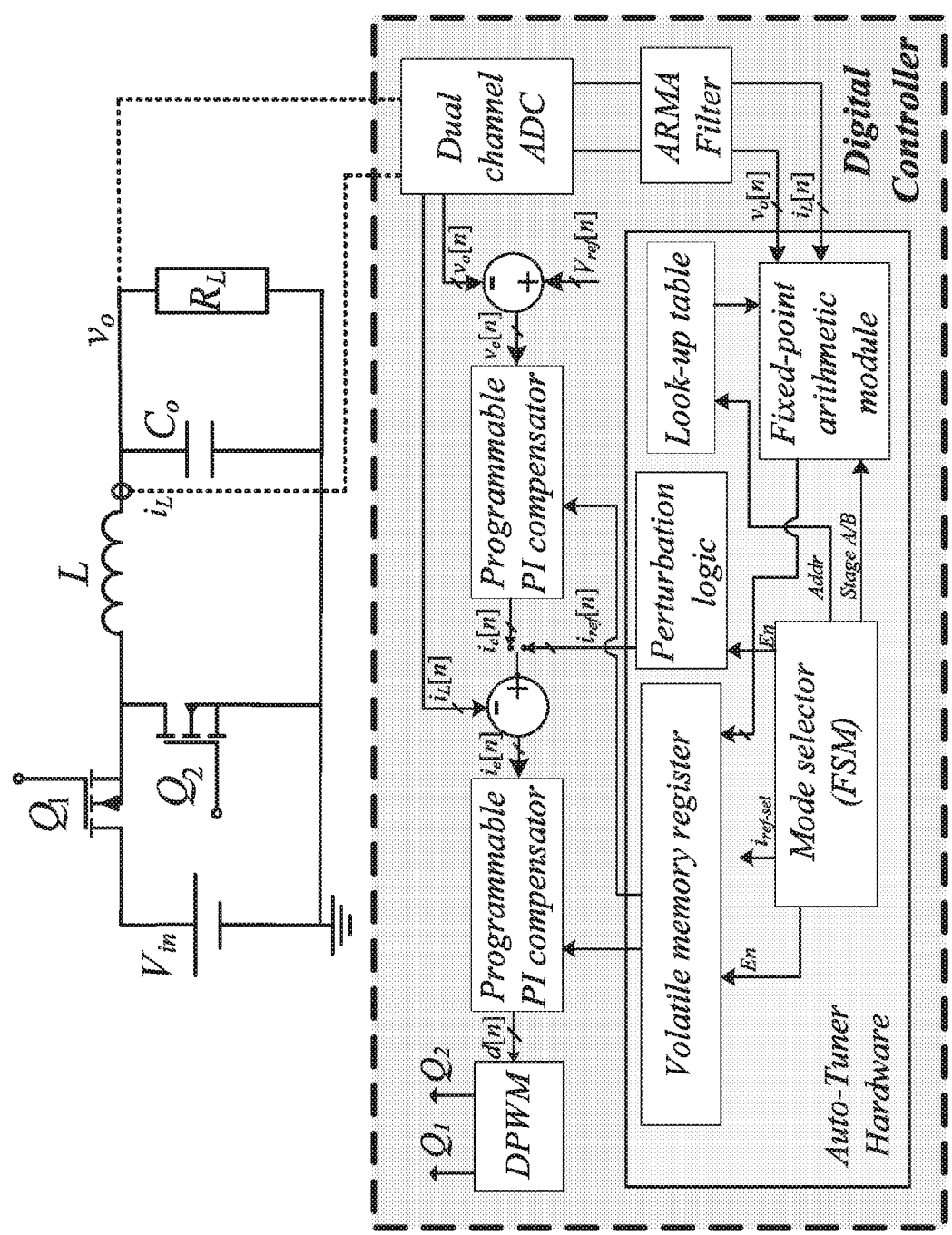
FIG. 28 is a full block diagram of the digital auto-tuning ACM controller.

FIG. 28 shows a schematic diagram of a buck converter with the implemented digital auto-tuning ACM controller. The controller relies on three key building blocks: 1) a dual-channel adaptive 10-bit Delay-Line (DL) based window ADC. 2) a 12-bit programmable PI compensators, that have been realized with shared hardware resources for calculations, resulting in reduced power consumption and logic element count. 3) a 12-bit hybrid High-Resolution DPWM (HR-DPWM).

FIG. 28 illustrates the auto-tuner hardware module as part of the complete block diagram of the digital auto-tuning ACM controller. It can be observed that the auto-tuner module based on several main units:

- Mode selector that is realized by a Finite State-Machine (FSM), and is responsible for executing the tuning procedure as described in FIG. 15.
- Perturbation logic block that initiates a variation of the current reference of the inner current loop at stage II of the tuning procedure, which eventually results in a mismatch between the inductor current and the load current as described in the design procedure.
- A volatile memory register and a fixed-point arithmetic module, which calculates and stores the extracted coefficients of both the voltage and current compensators.

In order to implement a hardware efficient digital auto-tuning system and to simplify the arithmetic operations that calculates the compensators' coefficients according to Eq. 21, and Eq. 26, the realization of the arithmetic module relies on a simple set of Look-Up Tables (LUTs). One LUT is responsible for extracting the compensator's zero $f_0$ according to the desired phase margin $\varphi_m$. Another LUT extracts the ratio between the crossover frequency $f_c$ and the switching frequency $f_{sw}$, for both the inner and outer loops. It should be noted that the LUTs consist of pre-stored values that are selected by the mode selector. Additionally, all other calculations have been performed by one unsigned 16×16 bits multiplier, one signed 16×16 bits multiplier and one unsigned 16-bit divider.

Experimental Verification

The auto-tuning algorithm and the control hardware were fully coded in VHDL and implemented on a Cyclone IV FPGA, including custom design of an all-digital adaptive 10-bit window delay-line ADC and 12-bit DPWM. The tuning and control VHDL representations were synthesized and implemented using Quartus environment, resulting in approximately 3,000 logic cells. To demonstrate the operation of the auto-tuning algorithm and to validate closed-loop operation of the ACM controller, a 12V-to-1.2V synchronous buck converter prototype has been built and tested.

TABLE 3

EXPERIMENTAL PROTOTYPE VALUES

| Component | Value/Type |
| --- | --- |
| Input voltage $V_{in}$ | 12 V |
| Nominal output voltage | 1.2 V |
| $V_{out}$ | 8 A |
| Nominal output current $I_{out}$ | 500 kHz |
| Switching frequency $f_{sw}$ | |
| Inductor L | 1 µH, 5 mΩ DCR |
| Capacitor $C_{out}$ | 100 µF, 5 mΩ ESR |
| Power-stage | SiC620A |

Figure 29B:
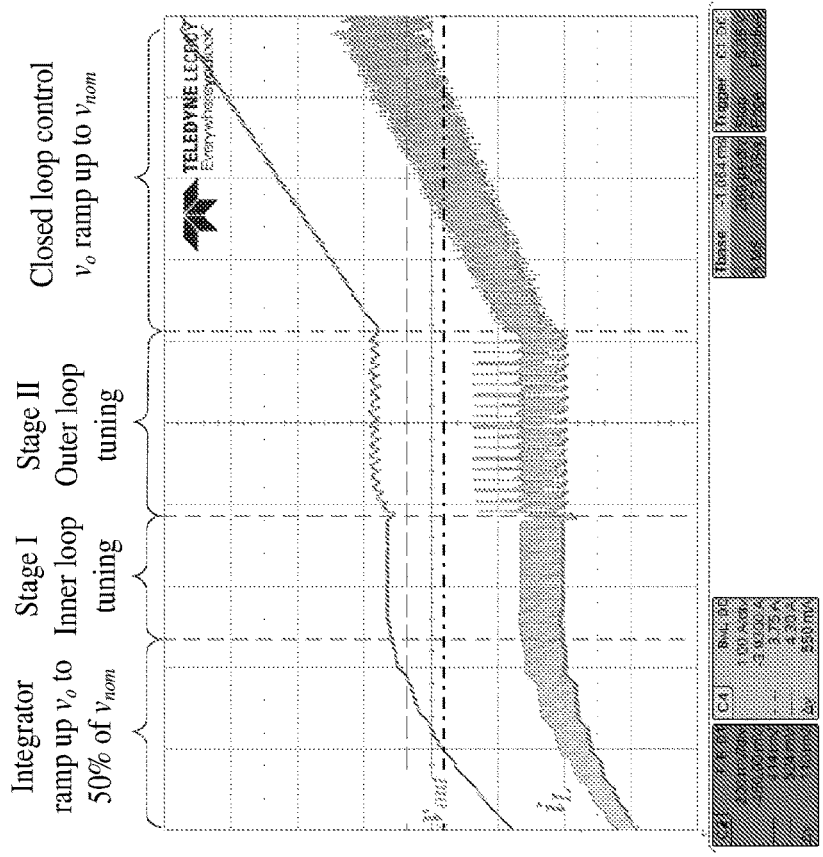
FIG. 29 shows experimental results of the soft-start period with auto-tuning: (a) soft-start and regulation, (b) zoom in on the tuning procedure (Vout 200 mV/div, iL 1 A/div, time scale is 200 µs/div)
Figure 29A:
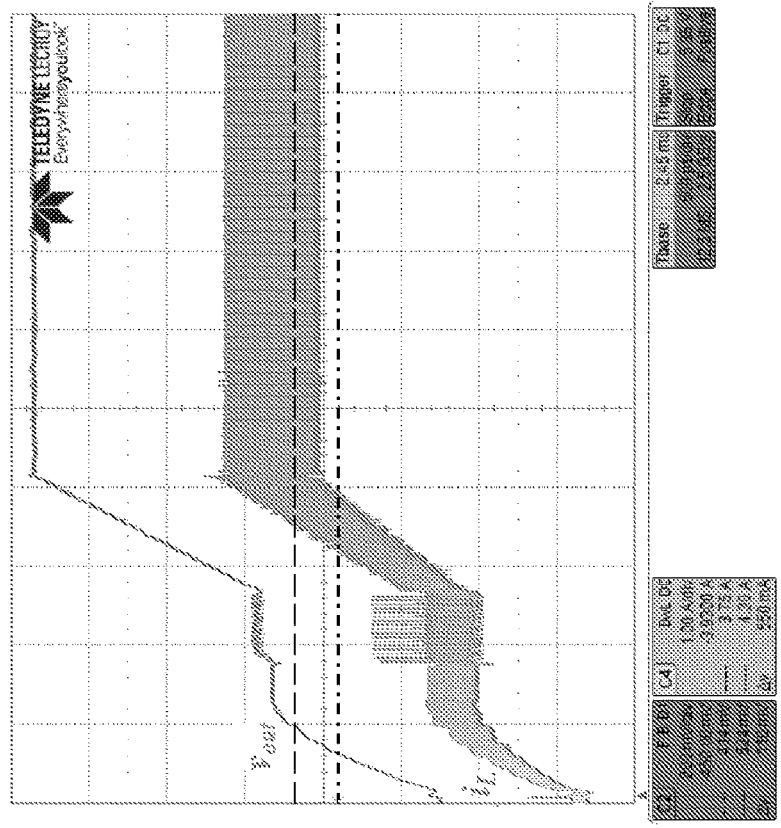

FIG. 29 shows the output voltage and inductor current during the tuning soft-start operation, whereas the inductor L=1 µH and output capacitor $C_{out}$=100 µF. It can be observed that the while converter's soft-start operation lasts approximately 2 ms, the tuning procedure is conducted under than 0.6 ms. The dynamic behavior of the tuned controller detonating tightly regulation of the output voltage under load transient events of 5.5 A is depicted in FIG. 31. For the loading transient event an output voltage undershoot of 110 mV has been measured with settling time of 38 µs, whereas for the unloading event the output voltage overshoot has been measured to be 140 mV and 45 µs is the time it takes for the system to set back to steady-state.

Figure 30:
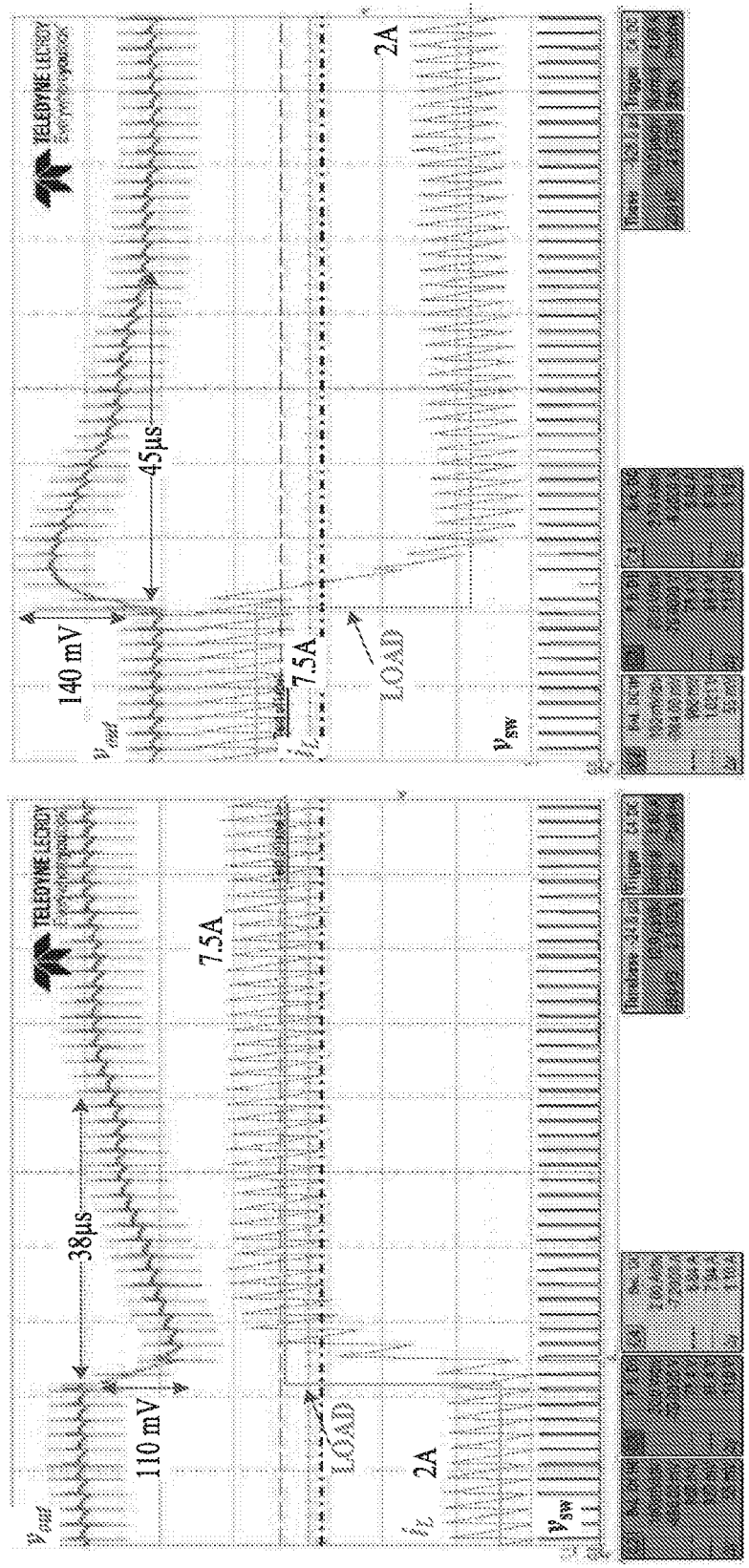
FIG. 30 shows experimental load steps of 6 A with 1 µH inductor and 100 µF ceramic output capacitor.

FIG. 30 shows experimental load steps of 6 A with 1 µH inductor and 100 µF ceramic output capacitor ($v_{out}$ 100 mV/div, $i_L$ 2 A/div, $V_{sw}$ 20V/div, time scale is 10 µs/div). To verify the effectiveness of the new auto-tuning ACM controller, the system was tested with several combinations of inductors and output capacitors. The target parameters for the compensators design were $f_{cI}$=80 kHz, $f_{0,I}$=8 kHz for the inner current loop and $f_{cV}$=40 kHz, $f_{0,V}$=8 kHz for the outer voltage loop, respectively. Table 4 summarizes the tuning results for inner current and outer voltage loops compensators coefficients extraction for various values of LC filter. It can be observed that, the coefficients extracted by the hardware are found to be in very good agreement with the theoretical results over wide range of operating conditions. The slight discrepancy between the theoretical are within the numerical error of the calculation units.

TABLE 4

Auto-tuning Results with Different Inductors and Output Capacitors

| | | Derived LC | | Current Loop Extracted Coefficients | | Voltage Loop Extracted Coefficients | |
|---|---|---|---|---|---|---|---|
| L [µH] | $C_{out}$ [µF] | L [µH] | $C_{out}$ [µF] | $a_i$ | $b_i$ | $a_v$ | $b_v$ |
| 0.5 | 50 | 0.528 | 54.3 | 0.01382 | 0.01268 | 13.65 | 12.28 |
| 1 | 100 | 0.978 | 106 | 0.0256 | 0.02349 | 26.6 | 23.96 |
| 2.2 | 150 | 2.3 | 157 | 0.06021 | 0.05523 | 39.46 | 35.49 |

To further validate the tuning algorithm and showcase the quality of the performance in closed-loop, the experimental prototype has been tested over a wider range of load variations of 12 A, as shown in FIG. 31. For a 1.2 A-to-13.2 A loading event, the output voltage undershoot was 220 mV with settling time of 25 µs, and for a 12 A unloading event the output voltage overshoot was 360 mV and the settling time was 30 µs. It can be noticed that even for high load step transients the auto-tuning ACM controller demonstrates relatively rapid dynamics with reasonable and comparable performance. It should be further emphasized that the target specifications (bandwidth and phase margin) for the compensators design have been predefined to achieve system stability for wide range of converter parameters. However, these parameters can be refined by the user for better dynamic performance at specific target parameters.

FIG. 31 shows experimental load steps of 12 A with 1 µH inductor and 150 µF ceramic output capacitor ($v_{out}$ 200 mV/div, $i_L$ 5 A/div, $V_{sw}$ 20V/div, time scale is 10 µs/div).

Although embodiments of the invention have been described by way of illustration, it will be understood that the invention may be carried out with many variations, modifications, and adaptations, without exceeding the scope of the claims.

The invention claimed is:

1. A digital controller for controlling an average-current-mode voltage regulator having an output connected to a load, said controller comprises:
    a) a digital voltage-sampling window Analog-to-Digital Converter (ADC), based on Delay-Lines (DLs) and configured to obtain a sample of a voltage error signal being the difference between the reference voltage and the output voltage, and to convert said voltage error signal from analog to digital representation;
    b) a digital current-sampling window ADC, based on DLs and configured to obtain a sample of the inductor current and to convert said inductor current from analog to digital representation, wherein said window DL-ADC has a constant reference value for the voltage and fixed sampling window for the current, while sampling both the output voltage and inductor current, such that the difference between the inductor current and a constant reference represents the current error;
    c) a digital compensator for voltage regulation, receiving as input the digital voltage error signal, configured to generate a current reference signal based thereupon;
    d) a digital compensator for current regulation, receiving as inputs the inductor current signal and the current reference signal, configured to generate a duty-ratio command signal based thereupon; and
    e) a digital hybrid High Resolution (HR) Digital Pulse Width Modulator (HR-DPWM) receiving as input the duty-ratio command signal and generating a pulse-width-modulated signal that is fed to the gates of the converter's transistors, to thereby control the current and voltage supplied to said load,
    wherein the digital voltage-sampling window ADC and the digital current-sampling window ADC are a single digital window ADC based on DLs, said single digital window ADC further comprises:
    f) an input multiplexer (MUX) and an output de-multiplexer for switching between voltage and current sampling.

2. The controller according to claim 1, wherein the digital voltage-sampling window ADC and the digital current-sampling window ADC are based on standard-cell technology with no modifications.

3. The controller according to claim 1, wherein the digital current reference compensator and the digital duty-ratio reference compensator are first order compensators.

4. The controller according to claim 1, wherein the HR-DPWM comprises:
    a) a coarse-counting block comprising a delayed clock-chain, the block receiving as input a reference clock and a first portion of bits from the duty-ratio command signal, and generating, by the delayed clock-chain, a time-base signal and a coarse-delayed version of said time-base signal;
    b) a fine-counting block comprising a delay-line, the block receiving as input the delayed version of the time-base signal and a second portion of bits from the duty-ratio command signal, and generating, by the delay-line, a high-resolution delayed signal; and
    c) a logic block receiving as input the Most Significant Bit (MSB) of the duty-ratio command signal, the time-base signal, and the high-resolution delayed signal; and
    generating the pulse-width-modulated signal that controls the gates of the transistors, wherein the MSB of the duty-ratio command signal serves as a selector between a pulse-width-modulated signal with duty cycle higher than 0.5 and a pulse-width-modulated signal with duty cycle lower than 0.5.

5. The controller according to claim 4, further comprising a segmented-reference generator configured to split the current reference signal to two portions, the first portion used for coarse-tuning the reference pulse, the second portion used as an offset to be subtracted from the current-sampling DL ADC's output so as to fine-tune the current error signal.

6. The controller according to claim 1, further comprising a reference pulse generator, configured to convert the current reference signal into an adaptive reference pulse, thereby allowing the digital voltage-sampling Delay-Line based window Analog-to-Digital Converter (DL-ADC) to be used for its full load range.

7. The digital average-current-mode voltage regulator controller according to claim 1, wherein the digital voltage-loop compensator and the digital current-loop compensator are auto-tuned in an auto tuning process, comprising the steps of:
   a) defining a default set of coefficients either according to an initial specification of the output target or to satisfy stability of the controller and its output with low bandwidth that is derived as a fraction of switching frequency;
   b) loading the default set of coefficients to the compensators;
   c) extracting coefficients for the digital current-loop compensator from measurements of the output voltage and from the inductor current ripple;
   d) driving a small current step from the digital current-loop compensator to the voltage output and perturb its voltage; and
   e) estimate, from the effect of output capacitor's capacitance to a current perturbation, information required to set coefficients of the digital voltage-loop compensator, wherein the auto-tuning process is performed by:
      i) extracting coefficient for the current loop from the inductor's current ripple by sampling twice per switching cycle; and
      ii) extracting of the coefficients of the voltage loop, using the inner current loop as a current source.

8. The digital average-current-mode voltage regulator controller according to claim 7, wherein the auto-tuning process is activated upon power-up.

9. The digital average-current-mode voltage regulator controller according to claim 8, comprising an outer voltage loop and an inner current loop with different bandwidths.

10. The digital average-current-mode voltage regulator controller according to claim 8, wherein whenever the loops are decoupled, each loop is regulated using a single state-variable.

11. The digital average-current-mode voltage regulator controller according to claim 7, comprising an outer voltage loop and an inner current loop.

12. A digital controller for controlling average-current-mode voltage regulator having an output connected to a load and an auto-tuning capability, said controller comprising:
   a) a digital voltage-sampling window analog-to-digital converter (ADC), based on delay-lines (DLs) and configured to obtain a sample of the difference between the reference voltage and the output voltage (voltage error signal), and to convert said voltage error signal from analog to digital representation;
   b) a digital current-sampling window ADC, based on DLs and configured to obtain a sample of the inductor current and to converter said inductor current from analog to digital representation;
   c) a digital voltage-loop compensator receiving as input the digital voltage error signal, configured to generate a current reference signal based thereupon;
   d) a digital current-loop compensator receiving as inputs the inductor current signal and the current reference signal, configured to generate a duty-ratio command signal based thereupon; and
   e) a digital hybrid high resolution (HR) digital pulse width modulator (DPWM) receiving as input the duty-ratio command signal and generating a pulse-width-modulated signal that is fed to the gates of the converter's transistors to thereby control the current and voltage supplied to said load, wherein said digital voltage-loop compensator and said digital current-loop compensator are auto-tuned according to an auto-tuning process that comprises the following steps:

f) defining a default set of coefficients either according to an initial specification of the output target voltage or to satisfy stability of the controller and its output with a low bandwidth, derived as a fraction of switching frequency;

g) loading said default set of coefficients to each compensator;

h) extracting coefficients for the digital current-loop compensator from the output current;

i) driving a small current step from said current-loop compensator to the voltage output and perturbing its voltage; and j) estimating, from the output capacitor's capacitance, data required to set coefficients of said digital voltage-loop compensator;

wherein the digital voltage-sampling window ADC and the digital current-sampling window ADC are a single digital window ADC based on DLs, said single digital window ADC further comprises:

k) an input multiplexer (MUX) and an output de-multiplexer for switching between voltage and current sampling.

* * * * *